United States Patent
Qu et al.

(10) Patent No.: US 11,844,251 B2
(45) Date of Patent: Dec. 12, 2023

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yi Qu, Beijing (CN); Tinghua Shang, Beijing (CN); Lulu Yang, Beijing (CN); Meng Zhang, Beijing (CN); Siyu Wang, Beijing (CN); Xiaofeng Jiang, Beijing (CN); Yupeng He, Beijing (CN); Huijun Li, Beijing (CN); Xin Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 195 days.

(21) Appl. No.: 17/427,194

(22) PCT Filed: Apr. 15, 2021

(86) PCT No.: PCT/CN2021/087459
§ 371 (c)(1),
(2) Date: Jul. 30, 2021

(87) PCT Pub. No.: WO2021/238486
PCT Pub. Date: Dec. 2, 2021

(65) Prior Publication Data
US 2022/0320245 A1 Oct. 6, 2022

(30) Foreign Application Priority Data
May 29, 2020 (CN) .......................... 202010479764.9

(51) Int. Cl.
H01L 27/32 (2006.01)
H10K 59/131 (2023.01)
G09G 3/3233 (2016.01)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC .......... G09F 9/33; G09G 3/32; G09G 3/3225; G09G 3/3233; G09G 2300/0426;
(Continued)

(56) References Cited

U.S. PATENT DOCUMENTS 9,257,493 B2 2/2016 Lee et al.
10,811,436 B2 10/2020 Wang et al.
(Continued)

FOREIGN PATENT DOCUMENTS

CN   103872080 A   6/2014
CN   104600081 A   5/2015
(Continued)

OTHER PUBLICATIONS

Extended European Search Report dated Oct. 13, 2022 received in European Patent Application No. EP 21755883.2.
(Continued)

*Primary Examiner* — Stacy Khoo
(74) *Attorney, Agent, or Firm* — Scully, Scott, Murphy & Presser, P.C.

(57) ABSTRACT

A display substrate and a display device. The display substrate includes a base substrate and a plurality of sub-pixels on the base substrate. Each sub-pixels includes a pixel circuit. The plurality of sub-pixels include a first sub-pixel. The compensation sub-circuit of the first sub-pixel includes a first electrode, a second electrode, and a connection
(Continued)

portion between the first electrode and the second electrode. The first drive electrode of the light-emitting element of the first sub-pixel includes a first main body portion including a first side parallel to a certain direction, and a first protruding portion protruding from the first side of the first main body portion. The first protruding portion at least partially overlaps with the connection portion of the compensation sub-circuit of the first sub-pixel in a direction perpendicular to the base substrate. The light-emitting element of the first sub-pixel is configured to emit green light.

18 Claims, 15 Drawing Sheets

(52) U.S. Cl.
CPC ............... *G09G 2300/0819* (2013.01); *G09G 2300/0842* (2013.01); *G09G 2320/0233* (2013.01)

(58) Field of Classification Search
CPC ... G09G 2300/0819; G09G 2300/0842; G09G 2300/0861; G09G 2310/0251; G09G 2320/0233; H10K 50/81; H10K 59/12; H10K 59/121; H10K 59/126; H10K 59/131
See application file for complete search history.

(56) References Cited

U.S. PATENT DOCUMENTS

| | | | |
|---|---|---|---|
| 10,903,248 | B2 | 1/2021 | Bae et al. |
| 11,004,874 | B2 | 5/2021 | Zhou et al. |
| 2007/0176513 | A1 | 8/2007 | Ohara et al. |
| 2008/0043165 | A1 | 2/2008 | Kim |
| 2014/0124754 | A1 | 5/2014 | Park et al. |
| 2016/0359054 | A1 | 12/2016 | Fang et al. |
| 2017/0011685 | A1 | 1/2017 | Jeon |
| 2018/0040639 | A1 | 2/2018 | Lee et al. |
| 2019/0288055 | A1 | 9/2019 | Sakai et al. |
| 2019/0355802 | A1 | 11/2019 | Shim et al. |
| 2020/0013337 | A1 | 1/2020 | Cho et al. |
| 2021/0328000 | A1 | 10/2021 | Jia et al. |

FOREIGN PATENT DOCUMENTS

| | | |
|---|---|---|
| CN | 107492567 A | 12/2017 |
| CN | 107681063 A | 2/2018 |
| CN | 109300995 A | 2/2019 |
| CN | 110098196 A | 8/2019 |
| CN | 110299384 A | 10/2019 |
| CN | 110610684 A | 12/2019 |
| CN | 110690360 A | 1/2020 |
| CN | 210403734 U | 4/2020 |
| CN | 11112808 A | 5/2020 |
| CN | 111128080 A | 5/2020 |
| CN | 111429843 A | 7/2020 |
| JP | 2007060248 A | 3/2007 |
| KR | 20080001941 A | 1/2008 |

OTHER PUBLICATIONS

First Office Action dated Apr. 27, 2022 received in Chinese Patent Application No. CN 202010479764.9 together with an English language translation.

DISPLAY SUBSTRATE AND DISPLAY DEVICE

CROSS-REFERENCE TO RELATED APPLICATIONS

The present application is a national stage of PCT International Application No. PCT/CN2021/087459, filed on Apr. 15, 2021, which claims priority to Chinese Patent Application No. 202010479764.9, filed on May 29, 2020, the entire disclosures of which are incorporated herein by reference as part of the disclosure of this application.

TECHNICAL FIELD

Embodiments of the present disclosure relate to a display substrate and a display device.

BACKGROUND

In the field of OLED (Organic Light-Emitting Diode) display, with the rapid development of high-resolution products, higher requirements are put forward on the structural design of the display substrate, such as arrangements of pixels and signal lines.

SUMMARY

At least one embodiment of the present disclosure provides a display substrate, comprising: a base substrate; a plurality of sub-pixels in an array on the base substrate. Each of the plurality of sub-pixels comprises a pixel circuit and a light-emitting element, the pixel circuit is configured to drive the light-emitting element to emit light, the plurality of sub-pixels are arranged in a first direction and in a second direction, and the first direction is different from the second direction; the pixel circuit comprises a drive sub-circuit and a compensation sub-circuit; the drive sub-circuit comprises a control electrode, a first terminal, and a second terminal, and is configured to be connected to the light-emitting element and to control a drive current flowing through the light-emitting element; the compensation sub-circuit comprises a control electrode, a first electrode, and a second electrode, the control electrode of the compensation sub-circuit is configured to receive a scan signal, the first electrode and the second electrode of the compensation sub-circuit are connected to the second terminal and the control electrode of the drive sub-circuit, respectively, and the compensation sub-circuit is configured to perform threshold compensation on the drive sub-circuit in response to the scan signal; the light-emitting element comprises a first electrode, a light-emitting layer, and a second electrode which are stacked in sequence, and the first electrode of the light-emitting element is located on a side of the light-emitting layer near the base substrate; the compensation sub-circuit further comprises a connection portion which is located between the first electrode and the second electrode of the compensation sub-circuit and connects the first electrode to the second electrode; and the first electrode, the second electrode, and the connection portion are all located on a same side of the control electrode of the compensation sub-circuit with respect to the base substrate; and the plurality of sub-pixels comprises a first sub-pixel, and a first drive electrode of a light-emitting element of the first sub-pixel comprises a first main body portion comprising a first side parallel to a certain direction and a first protruding portion protruding from the first side of the first main body portion, and the first protruding portion at least partially overlaps with the connection portion of the compensation sub-circuit of the first sub-pixel in a direction perpendicular to the base substrate; the light-emitting element of the first sub-pixel is configured to emit green light.

In some examples, the first side of the first main body portion is a straight side and is parallel to the first direction, and the protruding portion protrudes from the first side of the first main body portion in the second direction.

In some examples, the connection portion comprises a first semiconductor region, a conductive region, and a second semiconductor region, the first semiconductor region separates the first electrode of the compensation sub-circuit from the conductive region, and the second semiconductor region separates the second electrode of the compensation sub-circuit from the conductive region; and the first semiconductor region, the second semiconductor region, the conductive region, the first electrode, and the second electrode of the compensation sub-circuit are located on a same semiconductor layer and are of an integral structure.

In some examples, the first drive electrode of the light-emitting element of the first sub-pixel at least partially overlaps with the first semiconductor region of the compensation sub-circuit of the first sub-pixel in the direction perpendicular to the base substrate.

In some examples, a ratio of an area of the first semiconductor region of the compensation sub-circuit of the first sub-pixel that overlaps with the first drive electrode of the light-emitting element of the first sub-pixel in the direction perpendicular to the base substrate to an area of the first semiconductor region is 50%-100%.

In some examples, the first protruding portion at least partially overlaps with the conductive region of the compensation sub-circuit of the first sub-pixel in the direction perpendicular to the base substrate.

In some examples, the display substrate further comprises a shield electrode located on a side of the control electrode of the compensation sub-circuit of the first sub-pixel away from the base substrate. The shield electrode at least partially overlaps with the conductive region of the compensation sub-circuit of the first sub-pixel in the direction perpendicular to the base substrate; and in the direction perpendicular to the base substrate, an overlapping area between the conductive region of the compensation sub-circuit of the first sub-pixel and the first protruding portion is less than an overlapping area between the conductive region of the compensation sub-circuit of the first sub-pixel and the shield electrode.

In some examples, the conductive region is L-shaped and comprises a first branch and a second branch, the first branch extends in the second direction and is directly connected to the first semiconductor region of the compensation sub-circuit; and the second branch extends in the first direction and is directly connected to the second semiconductor region of the compensation sub-circuit.

In some examples, the compensation sub-circuit comprises a compensation transistor having a gate, a first electrode, and a second electrode which serve as the control electrode, the first electrode, and the second electrode of the compensation sub-circuit, respectively; and the gate of the compensation transistor comprises a first gate and a second gate, an orthographic projection of the first semiconductor region on the base substrate is located within an orthographic projection of the first gate on the base substrate, an orthographic projection of the second semiconductor region on the base substrate is located within an orthographic projection of the second gate on the base substrate, and the conductive region does not overlap with either the first gate or the second gate in the direction perpendicular to the base substrate.

In some examples, in the second direction, the first protruding portion has a size less than that of the first gate of the compensation sub-circuit.

In some examples, an orthographic projection of the first drive electrode of the light-emitting element on the base substrate comprises a first portion and a second portion located on two sides of the orthographic projection of the first gate of the compensation sub-circuit on the base substrate in the second direction, the first portion at least partially overlaps with an orthographic projection of the conductive region of the compensation sub-circuit on the base substrate; and the first portion has an area less than 1/10 of a total area of the orthographic projection of the first drive electrode of the light-emitting element on the base substrate.

In some examples, in the first direction, the first protruding portion has a maximum dimension which is 1/8-1/3 of a maximum dimension of the first drive electrode of the light-emitting element.

In some examples, in the second direction, the first protruding portion has a maximum dimension of less than 3 microns.

In some examples, the plurality of sub-pixels further comprise a second sub-pixel, a first drive electrode of a light-emitting element of the second sub-pixel and the first drive electrode of the light-emitting element of the first sub-pixel are arranged side by side in the second direction, and the first drive electrode of the light-emitting element of the second sub-pixel comprises a second side parallel to and opposite to the first side of the first main body portion of the first drive electrode of the light-emitting element of the first sub-pixel.

In some examples, the first protruding portion of the compensation sub-circuit of the first sub-pixel has a maximum dimension in the second direction less than 1/3 of a spacing between the first side and the second side.

In some examples, the first semiconductor region of the compensation sub-circuit of the second sub-pixel does not overlap with the first electrode of the light-emitting element of the second sub-pixel in the direction perpendicular to the base substrate.

In some examples, the first drive electrode of the light-emitting element of the second sub-pixel at least partially overlaps with the control electrode of the drive sub-circuit of the second sub-pixel in the direction perpendicular to the base substrate.

In some examples, a pixel circuit of the first sub-pixel and a pixel circuit of the second sub-pixel are arranged side by side in the second direction.

In some examples, the pixel circuit further comprises a first light-emitting (LE) control sub-circuit, the first light-emitting control sub-circuit is connected to the first terminal of the drive sub-circuit and a first voltage terminal and is configured to apply a first power supply voltage of the first voltage terminal to the first terminal of the drive sub-circuit in response to a first light-emitting control signal.

In some examples, the display substrate further comprises a scan line and a light-emitting control line, wherein the scan line and the light-emitting control line both extend in the first direction, the scan line is electrically connected to the control electrode of the compensation sub-circuit of the first sub-pixel to provide the scan signal, and the light-emitting control line is connected to the first light-emitting control sub-circuit of the first sub-pixel to provide the first light-emitting control signal.

In some examples, an orthographic projection of the first drive electrode of the light-emitting element of the first sub-pixel on the base substrate has a first center point located between an orthographic projection of the scan line on the base substrate and an orthographic projection of the light-emitting control line on the base substrate.

In some examples, the first center point of the orthographic projection of the first drive electrode of the light-emitting element of the first sub-pixel on the base substrate and a second center point of an orthographic projection of the first drive electrode of the light-emitting element of the second sub-pixel on the base substrate are located on two sides of the orthographic projection of the scan line on the base substrate in the second direction, respectively, and the first center point is closer to the orthographic projection of the scan line on the base substrate than the second center point.

In some examples, the plurality of sub-pixels further comprises a third sub-pixel, a first drive electrode of a light-emitting element of the third sub-pixel comprises a second main body portion and a second protruding portion, the second main body portion of the first drive electrode of the light-emitting element of the third sub-pixel comprises a third side parallel to the second direction, the protruding portion protrudes from the third side in the first direction, the second protruding portion of the first drive electrode of the light-emitting element of the third sub-pixel at least partially overlaps with the conductive region of the compensation sub-circuit of the third sub-pixel in the direction perpendicular to the base substrate.

In some examples, the plurality of sub-pixels further comprises a fourth sub-pixel, which is adjacent to the third sub-pixel in the first direction and is located on a side opposite to the third side of the second main body portion of the first drive electrode of the light-emitting element of the third sub-pixel, and the first drive electrode of the light-emitting element of the third sub-pixel at least partially overlaps with the conductive region of the compensation sub-circuit of the fourth sub-pixel in the direction perpendicular to the base substrate.

In some examples, the display substrate further comprises a scan line extending in the first direction, the scan line is electrically connected to the control electrode of the compensation sub-circuit of the first sub-pixel to provide the scan signal; the display substrate further comprises a pixel defining layer located on a side of the first drive electrode of the light-emitting element away from the base substrate, the pixel defining layer comprises a plurality of openings to define opening areas of the plurality of sub-pixels, respectively, and at least a part of the light-emitting layer of the light-emitting element of each sub-pixel is located in the opening corresponding to each sub-pixel; and the first sub-pixel, the third sub-pixel, and the fourth sub-pixel are arranged in the first direction; and in the direction perpendicular to the base substrate, the scan line overlaps with both the opening area of the third sub-pixel and the opening area of the fourth sub-pixel.

At least one embodiment of the present disclosure also provides a display device, comprising the display substrate of any embodiment above.

BRIEF DESCRIPTION OF THE DRAWINGS

In order to more clearly illustrate the technical solution of the embodiments of the present disclosure, the drawings of the embodiments will be briefly described in the following. It is apparent that the described drawings in the following

DETAILED DESCRIPTION

Figure 1A:
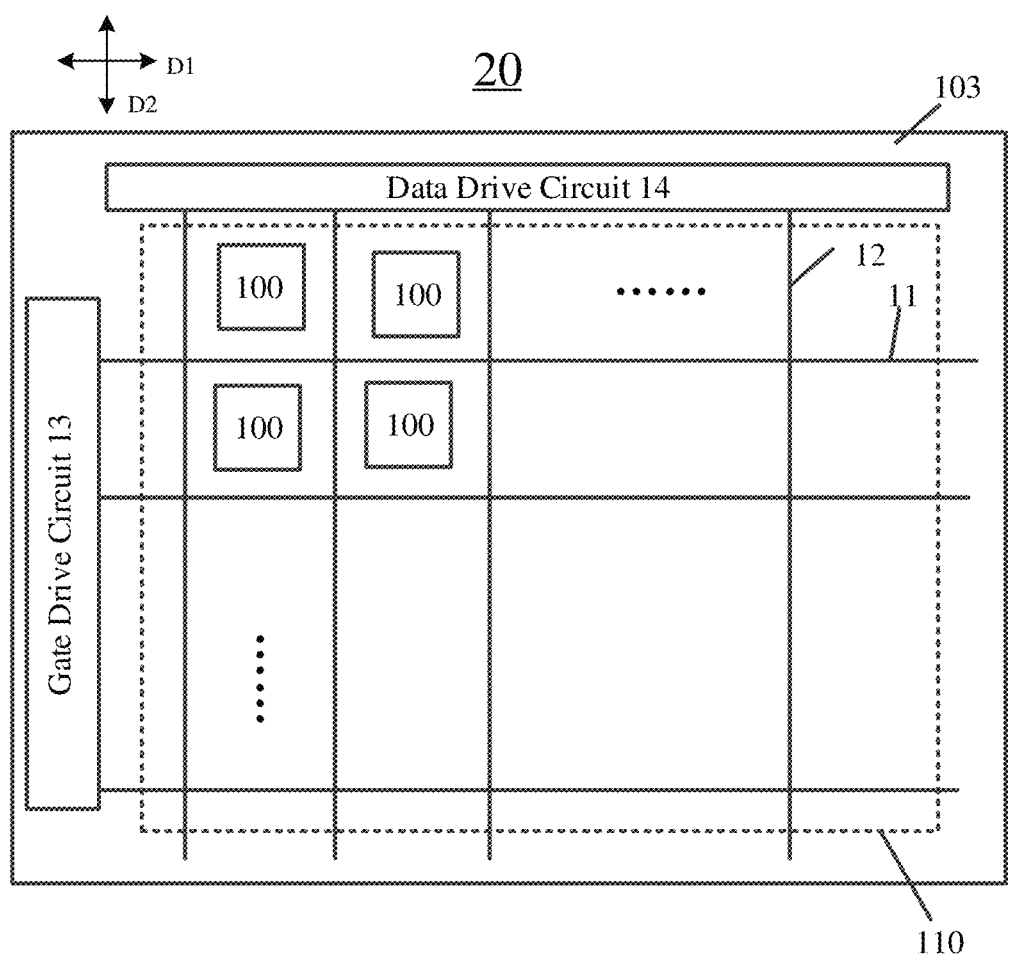
FIG. 1A is one schematic view of a display substrate provided by at least one embodiment of the present disclosure.

To make the objective, technical schemes, and advantages of the embodiments of the present disclosure clearer, technical schemes of the embodiments will be described in a clearly and fully understandable way in connection with the drawings related to the embodiments of the disclosure. Apparently, the described embodiments are just a part but not all of the embodiments of the disclosure. Based on the described embodiments herein, one of ordinary skill in the art can obtain other embodiment(s), without any creative labor, which shall be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the present disclosure, are not intended to indicate any sequence, amount or importance, but for distinguishing various components. Also, the terms, such as "a/an," "the" or the like, are not intended to limit the amount, but for indicating the existence of at least one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," or the like, are not limited to a physical connection or mechanical connection, but may include an electrical connection/coupling, directly or indirectly. The terms, "on," "under," "left," "right," or the like are only used to indicate relative position relationship, and when the absolute position of the object which is described is changed, the relative position relationship may be changed accordingly.

In the field of OLED (Organic Light-Emitting Diode) display, with the rapid development of high-resolution products, higher requirements are put forward on the structural design of the display substrate, such as the arrangements of pixels and signal lines. For example, compared to an OLED display device with a resolution of 4K, in an OLED display device with a large size and a resolution of 8K, the amounts of sub-pixel units that are to be provided is doubled, and correspondingly, the pixel density is also doubled. Thus, on the one hand, the line width of the signal line becomes small accordingly, which causes the resistance of the signal line itself to increase; in addition, there are more occasions where an overlap between the signal lines occurs, which causes the parasitic capacitance of the signal lines to increase. All these lead to an increase of the resistance capacitance (RC) load of the signal line. Accordingly, phenomena, such as signal delay (RC delay), voltage drop (IR drop) and voltage rise (IR rise) caused by the RC load would also become serious. These phenomena would seriously affect the display quality of the display products.

On the other hand, to improve display uniformity of the display panel, a pixel circuit with a compensation function can be used to drive light-emitting elements to eliminate the effect of unevenness of the threshold voltage of the drive transistor on the light-emitting current. The inventors have found that in a pixel circuit with a compensation function, the stability of the gate voltage of the drive transistor has an important impact on the display uniformity of the display substrate. For example, if the gate leakage of the drive transistor is severe, the gate voltage of the drive transistor will be under-compensated during the threshold compensation stage, that is, the threshold voltage of the drive transistor cannot be fully compensated, so that a drive current in the light-emitting stage is still related to the threshold voltage Vth of the drive transistor, which causes uniformity of the brightness of the display device to decrease.

The inventors have also found that the voltage stability of the gate of the drive transistor is not only related to the stability of the drive transistor itself, but also related to the stability of the circuit (or transistor) directly connected to the gate. For example, when the transistor directly connected to the gate is unstable, a charge leakage path may be formed, resulting in the insufficient compensation of the drive transistor and thus uneven display.

At least one embodiment of the present disclosure provides a display substrate comprising a base substrate and a plurality of sub-pixels distributed in an array on the base substrate. Each of the plurality of sub-pixels comprises a pixel circuit and a light-emitting (LE) element. The pixel circuit is configured to drive the light-emitting element to emit light. The plurality of pixel circuits are arranged in a first direction and in a second direction. Each of the plurality of pixel circuits comprises a drive sub-circuit and a compensation sub-circuit. The drive sub-circuit comprises a control electrode, a first terminal and a second terminal, and is configured to be connected to the light-emitting element and control a drive current flowing through the light-emitting element. The compensation sub-circuit comprises a control electrode, a first electrode, and a second electrode. The control electrode of the compensation sub-circuit is configured to receive a second scan signal. The first electrode and the second electrode of the compensation sub-circuit are respectively connected to the control electrode and the second terminal of the drive sub-circuit. The compensation sub-circuit is configured to perform threshold compensation on the drive sub-circuit in response to the second scan signal. The light-emitting element comprises a first drive electrode, a light-emitting layer, and a second driving electrode which are stacked in sequence. The first drive electrode is located on a side of the light-emitting layer near the base substrate. The compensation sub-circuit further comprises a connection portion which is located between the first electrode and the second electrode of the compensation sub-circuit. The connection portion comprises a first semiconductor region and a conductive region. The first semiconductor region separates the first electrode of the compensation sub-circuit from the conductive region. The first electrode, the second electrode, and the connection portion are all located on the same side of the control electrode of the compensation sub-circuit with respect to the base substrate. The orthographic projection of the first semiconductor region on the base substrate is located within the orthographic projection of the control electrode on the base substrate. The plurality of sub-pixels comprises a first sub-pixel. The first drive electrode of the light-emitting element of the first sub-pixel comprises a first main body portion comprising a first side parallel to a certain direction, and a first protruding portion protruding from the first side of the first main body portion. The first protruding portion at least partially overlaps with the connection portion of the compensation sub-circuit of the first sub-pixel in a direction perpendicular to the base substrate. The light-emitting element of the first sub-pixel is configured to emit green light.

According to the physiological structure of human eyes, the sensitivity of the human eyes to the green sub-pixel is much higher than that to the blue sub-pixel and the red sub-pixel. In the display substrate provided by at least one embodiment of the present disclosure, the first drive electrode of the light-emitting element of the green sub-pixel (first sub-pixel) is provided to block the connection portion between the first electrode and the second electrode of the compensation sub-circuit connected to the control electrode of the driving sub-pixel in the green sub-pixel, which avoids instability, such as threshold offset of the compensation sub-circuit, due to the light exposure of the connection portion, thereby improving the stability of the voltage on the control electrode of the drive sub-circuit, and thus improving the uniformity of the display substrate.

As illustrated in FIG. 1A, the display substrate 20 includes a display region 110 and a non-display region 103 outside the display region 110. For example, the non-display region 103 is located in an outer periphery of the display region 110. The display substrate 20 includes a plurality of sub-pixels 100 located in the display region 110. For example, the plurality of sub-pixels are arranged in an array, for example, a plurality of pixel rows and a plurality of pixel columns are arranged in a first direction D1 and a second direction D2. The first direction D1 and the second direction D2 are different from each other. For example, the first direction D1 and the second direction D2 are orthogonal to each other. For example, the pixel rows and the pixel columns do not necessarily extend strictly along a straight line, but may extend along a curve (for example, a zigzag line) which generally extends in the first direction D1 or the second direction D2, respectively.

Each sub-pixel includes a light-emitting (LE) element and a pixel circuit that drives the light-emitting element to emit light. For example, a plurality of pixel circuits are arranged in an array along the first direction D1 and the second direction D2. For example, the sub-pixels may form pixel units in a traditional RGB manner or in a manner of sub-pixel sharing (for example, pentile) to realize full-color display. The present disclosure does not limit the arrangement of sub-pixels and the manner of realizing full-color display.

For example, as illustrated in FIG. 1A, the display substrate 20 further includes a plurality of gate lines 11 and a plurality of data lines 12 as well as a plurality of pixel regions located in the display region 110, and each pixel region is correspondingly provided with one sub-pixel 100 therein. For example, the gate lines 11 extend in the first direction D1, and the data lines 12 extend in the second direction D2. FIG. 1A merely schematically illustrates a general positional relationship of the gate lines 11, the data lines 12 and the sub-pixels 100 in the display substrate, the positional relationship can be designed according to actual needs.

The pixel circuit is, for example, a 2T1C (i.e., two transistors and one capacitor) pixel circuit, 4T2C, 5T1C, 7T1C, or other nTmC (n and m are positive integers) pixel circuit. In different embodiments, the pixel circuit may further include a compensation sub-circuit, which includes an internal compensation sub-circuit or an external compensation sub-circuit. The compensation sub-circuit may include a transistor, a capacitor, and etc. For example, the pixel circuit may further include a reset circuit, a light-emitting control sub-circuit, a detection circuit, and etc., as required. For example, the display substrate may further include a gate drive sub-circuit 13 and a data drive sub-circuit 14 located in the non-display region. The gate drive sub-circuit 13 is connected to the pixel circuits through the gate lines 11 to provide various scan signals, and the data drive sub-circuit 14 is connected to the pixel circuits through the data lines 12 to provide data signals. The positional relationship of the gate drive sub-circuit 13 and the data drive sub-circuit 14, the gate lines 11, and the data lines 12 in the display substrate as illustrated in FIG. 1A is only an example, and the actual arrangement positions can be designed as required.

For example, the display substrate 20 may further include a control circuit (not shown). For example, the control circuit is configured to control the data drive sub-circuit 14 to apply the data signal and the gate drive sub-circuit to apply the scan signal. An example of the control circuit is a timing control circuit (T-con). The control circuit can be in various forms, for example, including a processor which runs executable codes to execute the above detection method and a memory which includes the executable codes.

For example, the processor may be a central processing unit (CPU) or a processing device of other forms with data processing capability and/or instruction execution capability, and may include, for example, a microprocessor, a programmable logic controller (PLC), and the like.

For example, a storage device may include one or more computer program products, and the computer program products may include various forms of computer-readable storage medium, such as volatile memory and/or non-volatile memory. The volatile memory may include random access memory (RAM) and/or cache memory (cache), for example. The non-volatile memory may include, for example, read-only memory (ROM), hard disk, flash memory, and etc. One or more computer program instructions can be stored on the computer-readable storage medium, and the processor can execute functions expected by the program instructions. Various application programs and various data can also be stored in the computer-readable storage medium.

Figure 1B:
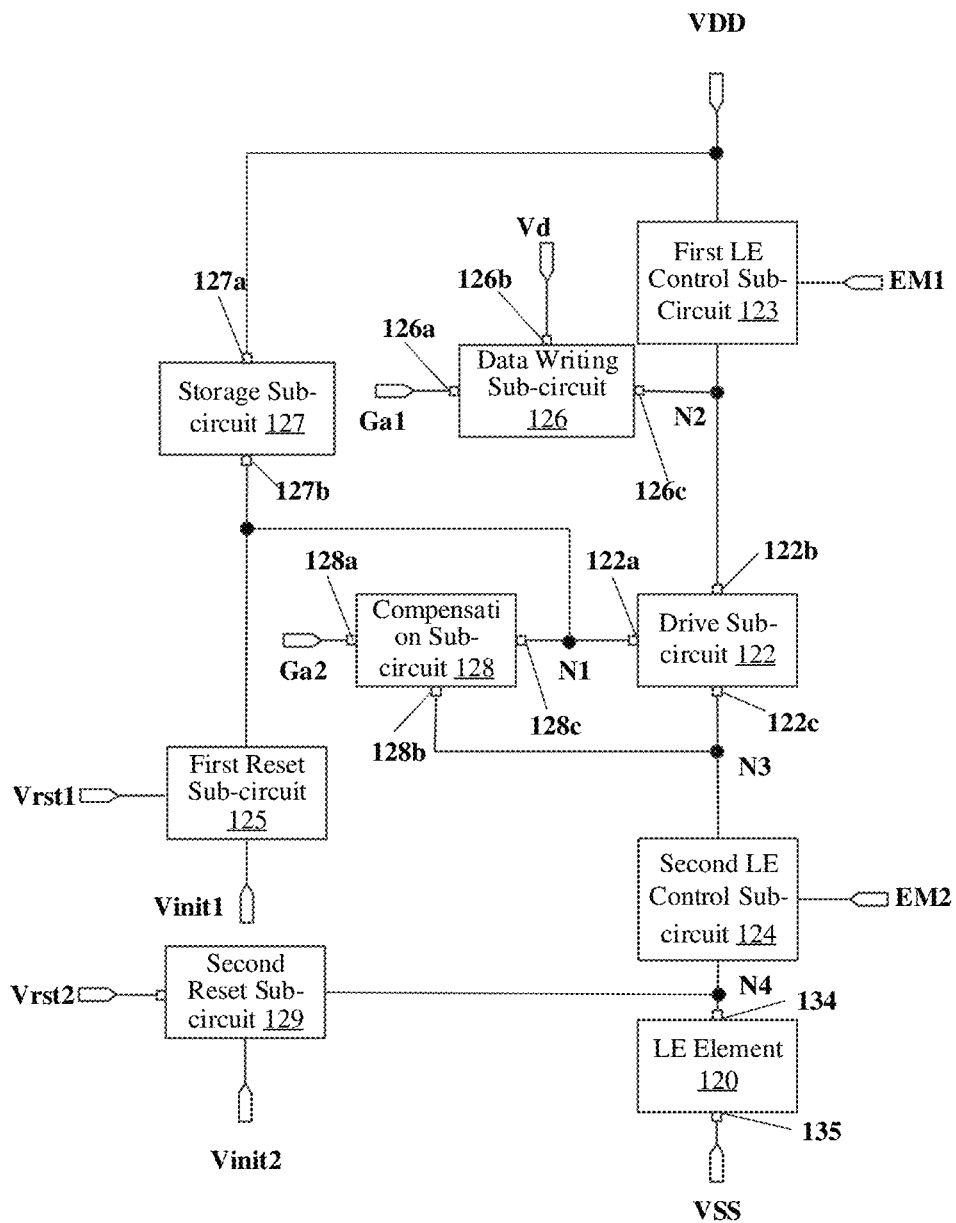
FIG. 1B is one pixel circuit diagram in a display substrate provided by at least one embodiment of the present disclosure.

The pixel circuit may include a drive sub-circuit, a data writing sub-circuit, a compensation sub-circuit and a storage sub-circuit, and may also include a light-emitting control sub-circuit, a reset circuit, and etc., as required. FIG. 1B illustrates a schematic diagram of a pixel circuit.

As illustrated in FIG. 1B, the pixel circuit includes a drive sub-circuit 122 and a compensation sub-circuit 128.

For example, the drive sub-circuit 122 includes a control terminal (control electrode) 122a, a first terminal 122b, and a second terminal 122c, and is configured to be connected to the light-emitting element 120 and control the drive current flowing through the light-emitting element 120. The control terminal 122a of the drive sub-circuit 122 is connected to a first node N1, the first terminal 122b of the drive sub-circuit 122 is connected to a second node N2, and the second terminal 122c of the drive sub-circuit 122 is connected to a third node N3.

For example, the compensation sub-circuit 128 includes a control terminal (control electrode) 128a, a first terminal (first electrode) 128b, and a second terminal (second electrode) 128c. The control terminal 128a of the compensation sub-circuit 128 is configured to receive a second scan signal Ga2. The first terminal 128b and the second terminal 128c of the compensation sub-circuit 128 are electrically connected to the second terminal 122c and the control terminal 122a of the drive sub-circuit 122, respectively. The compensation sub-circuit 128 is configured to perform threshold compensation on the drive sub-circuit 122 in response to the second scan signal Ga2.

For example, the compensation sub-circuit 128 further includes a connection portion which is located between the first electrode 128b and the second electrode 128c of the compensation sub-circuit and connects the first electrode 128b and the second electrode 128c. The connection portion of the compensation sub-circuit at least partially overlaps with a protruding portion of the first drive electrode of the light-emitting element of the first sub-pixel in a direction perpendicular to the base substrate. For example, the connection portion and the first electrode and the second electrode of the compensation sub-circuit are located on the same side of the control electrode of the compensation sub-circuit with respect to the base substrate. For example, the connection portion includes at least one semiconductor region. Detailed description thereof will be made later in connection with the specific structure of the display substrate.

For example, the pixel circuit further includes a data writing sub-circuit 126, a storage sub-circuit 127, a first light-emitting control sub-circuit 123, a second light-emitting control sub-circuit 124, and a first reset sub-circuit 125 and a second reset sub-circuit 129.

The data writing sub-circuit 126 includes a control terminal 126a, a first terminal 126b, and a second terminal 126c. The control terminal 126a is configured to receive a first scan signal Ga1. The first terminal 126b is configured to receive a data signal Vd. The second terminal 126c is connected to the first terminal 122b (i.e., the second node N2) of the drive sub-circuit 122. The data writing sub-circuit 126 is configured to write the data signal Vd into the first terminal 122b of the drive sub-circuit 122 in response to the first scan signal Ga1. For example, the first terminal 126b of the data writing sub-circuit 126 is connected to the data line 12 to receive the data signal Vd, and the control terminal 126a is connected to the gate line 11 as a scan line to receive the first scan signal Ga1. For example, in the data writing and compensation stage, the data writing sub-circuit 126 can be turned on in response to the first scan signal Ga1, so that the data signal can be written into the first terminal 122b (the second node N2) of the drive sub-circuit 122 and can be stored into the storage sub-circuit 127, and thus in the light-emitting stage, for example, a drive current for driving the light-emitting element 120 to emit light can be generated according to the data signal.

For example, the first scan signal Ga1 may be the same as the second scan signal Ga2. For example, the first scan signal Ga1 and the second scan signal Ga2 may be connected to the same signal output terminal. For example, the first scan signal Ga1 and the second scan signal Ga2 may be transmitted through the same scan line.

In other examples, the first scan signal Ga1 may be different from the second scan signal Ga2. For example, the first scan signal Ga1 and the second scan signal Ga2 may be connected to different signal output terminals. For example, the first scan signal Ga1 and the second scan signal Ga2 may be transmitted through different scan lines, respectively.

The storage sub-circuit 127 includes a first terminal (also referred to as a first storage electrode) 127a and a second terminal (also referred to as a second storage electrode) 127b. The first terminal 127a of the storage sub-circuit is configured to receive a first power supply voltage VDD. The second terminal 127b of the storage sub-circuit is electrically connected to the control terminal 122a of the drive sub-circuit. For example, in the data writing and compensation stage, the compensation sub-circuit 128 can be turned on in response to the second scan signal Ga2, so that the data signal written by the data writing sub-circuit 126 can be stored in the storage sub-circuit 127. Meanwhile, the compensation sub-circuit 128 may electrically connect the control terminal 122a and the second terminal 122c of the drive sub-circuit 122, so that the threshold voltage related information of the drive sub-circuit 122 can be correspondingly stored in the storage sub-circuit. Thus, in the light-emitting stage, for example, the stored data signal and the threshold voltage can be used to control the drive sub-circuit 122, so that the output of the drive sub-circuit 122 is compensated.

For example, the storage sub-circuit 127 is electrically connected to the control terminal 122a of the drive sub-circuit 122 and the first voltage terminal VDD, and the storage sub-circuit 127 is configured to store the data signal written by the data writing sub-circuit 126. For example, in the data writing and compensation stage, the compensation sub-circuit 128 may be turned on in response to the second scan signal Ga2, so that the data signal written by the data writing sub-circuit 126 can be stored in the storage sub-circuit 127. For example, also in the data writing and compensation stage, the compensation sub-circuit 128 can electrically connect the control terminal 122a and the second terminal 122c of the drive sub-circuit 122, so that the threshold voltage related information of the drive sub-circuit 122 can be correspondingly stored in the storage sub-circuit. Thus, in the light-emitting stage, for example, the stored data signal and the threshold voltage can be used to control the drive sub-circuit 122, so that the output of the drive sub-circuit 122 is compensated.

For example, the first light-emitting control sub-circuit 123 is connected to the first terminal 122b (the second node N2) of the drive sub-circuit 122 and the first voltage terminal VDD, and the first light-emitting (LE) control sub-circuit 123 is configured to apply the first power supply voltage of the first voltage terminal VDD to the first terminal 122b of the drive sub-circuit 122 in response to a first light-emitting control signal EM1. For example, as illustrated in FIG. 1B, the first light-emitting control sub-circuit 123 is connected to the first light-emitting control terminal EM1, the first voltage terminal VDD, and the second node N2.

For example, the second light-emitting (LE) control sub-circuit 124 is connected to the second light-emitting control terminal EM2, the first terminal 134 of the light-emitting element 120, and the second terminal 122c of the drive sub-circuit 122, and the second light-emitting (LE) control sub-circuit 124 is configured to allow the drive current to be applied to the light-emitting element 122 in response to the second light-emitting control signal.

For example, in the light-emitting stage, the second light-emitting control sub-circuit 123 is turned on in response to the second light-emitting control signal EM2 provided by the second light-emitting control terminal EM2, so that the drive sub-circuit 122 can be electrically connected with the light-emitting element 120 through the second light-emitting control sub-circuit 123, so as to drive the light-emitting element 120 to emit light under the control of the drive current. In the non-light-emitting stage, however, the second light-emitting control sub-circuit 123 is turned off in response to the second light-emitting control signal EM2, to prevent current from flowing through the light-emitting element 120 and allowing it to emit light, and thus the contrast of the corresponding display device can be improved.

For another example, in the initialization stage, the second light-emitting control sub-circuit 124 can also be turned on in response to the second light-emitting control signal, so that in corporation with the reset circuit, a reset operation can be performed on the drive sub-circuit 122 and the light-emitting element 120.

For example, the second light-emitting control signal EM2 may be the same as the first light-emitting control signal EM1. For example, the second light-emitting control signal EM2 may be connected to the same signal output terminal as the first light-emitting control signal EM. For example, the second light-emitting control signal EM2 can be transmitted through the same light-emitting control line as the first light-emitting control signal EM.

In some other examples, the second light-emitting control signal EM2 may be different from the first light-emitting control signal EM1. For example, the second light-emitting control signal EM2 and the first light-emitting control signal EM1 may be connected to different signal output terminals, respectively. For example, the second light-emitting control signal EM2 and the first light-emitting control signal EM1 may be transmitted through different light-emitting control lines, respectively.

For example, the first reset sub-circuit 125 is connected to a first reset voltage terminal Vinit1 and the control terminal 122a (the first node N1) of the drive sub-circuit 122, and the first reset sub-circuit 125 is configured to apply the first reset voltage Vinit1 to the control terminal 122a of the drive sub-circuit 122 in response to a first reset control signal Rst1.

For example, the second reset sub-circuit 129 is connected to a second reset voltage terminal Vinit2 and the first terminal 122b (the fourth node N4) of the light-emitting element 122, and the second reset sub-circuit 129 is configured to apply the second reset voltage Vinit2 to the first terminal 134 of the light-emitting element 120 in response to a second reset control signal Rst2.

For example, the first reset sub-circuit 125 and the second reset sub-circuit 129 may be turned on in response to the first reset control signal Rst1 and the second reset control signal Rst2, respectively, so that the second reset voltage Vinit2 can be applied to the first node N1 and the first reset voltage Vinit1 can be applied to the first terminal 134 of the light-emitting element 120, and thereby resetting the drive sub-circuit 122, the compensation sub-circuit 128, and the light-emitting element 120 to eliminate the affect of the previous light-emitting stage.

For example, the second reset control signal Rst2 of each row of sub-pixels and the first scan signal Ga1 of the row of sub-pixels may be the same signals, and may both be transmitted through the same gate line 11. For example, the first reset control signal Rst1 of each row of sub-pixels and the first scan signal Ga1 of the previous row of sub-pixels may be transmitted through the same gate line 11.

For example, the light-emitting element 120 includes a first terminal (also referred to as a first electrode or a first drive electrode) 134 and a second terminal (also referred to as a second electrode or a second driving electrode) 135. The first terminal 134 of the light-emitting element 120 is configured to be connected to the second terminal 122c of the drive sub-circuit 122, and the second terminal 135 of the light-emitting element 120 is configured to be connected to the second voltage terminal VSS. For example, in an example, as illustrated in FIG. 1B, the first terminal 134 of the light-emitting element 120 may be connected to the fourth node N4 through the second light-emitting control sub-circuit 124. The embodiments of the present disclosure include but are not limited to this.

It is to be noted that in the description of the embodiments of the present disclosure, the first node N1, the second node N2, the third node N3 and the fourth node N4 do not necessarily represent actual components, but represent meeting points of related circuits in a circuit diagram.

It is to be noted that in the description of the embodiments of the present disclosure, the symbol Vd can represent either a data signal terminal or a level of a data signal. Likewise, the symbols Ga1 and Ga2 can represent either the first scan signal and the second scan signal or the first scan signal terminal and the second scan signal terminal. The Rst can represent either the reset control terminal or the reset control signal. The symbols Vinit1 and Vinit2 can represent either the first reset voltage terminal and the second reset voltage terminal or the first reset voltage and the second reset voltage. The symbol VDD can represent either the first voltage terminal or the first power supply voltage. The symbol VSS can represent either the second voltage terminal or the second power supply voltage. These are applicable to the following embodiments and will not be repeated.

Figure 2A:
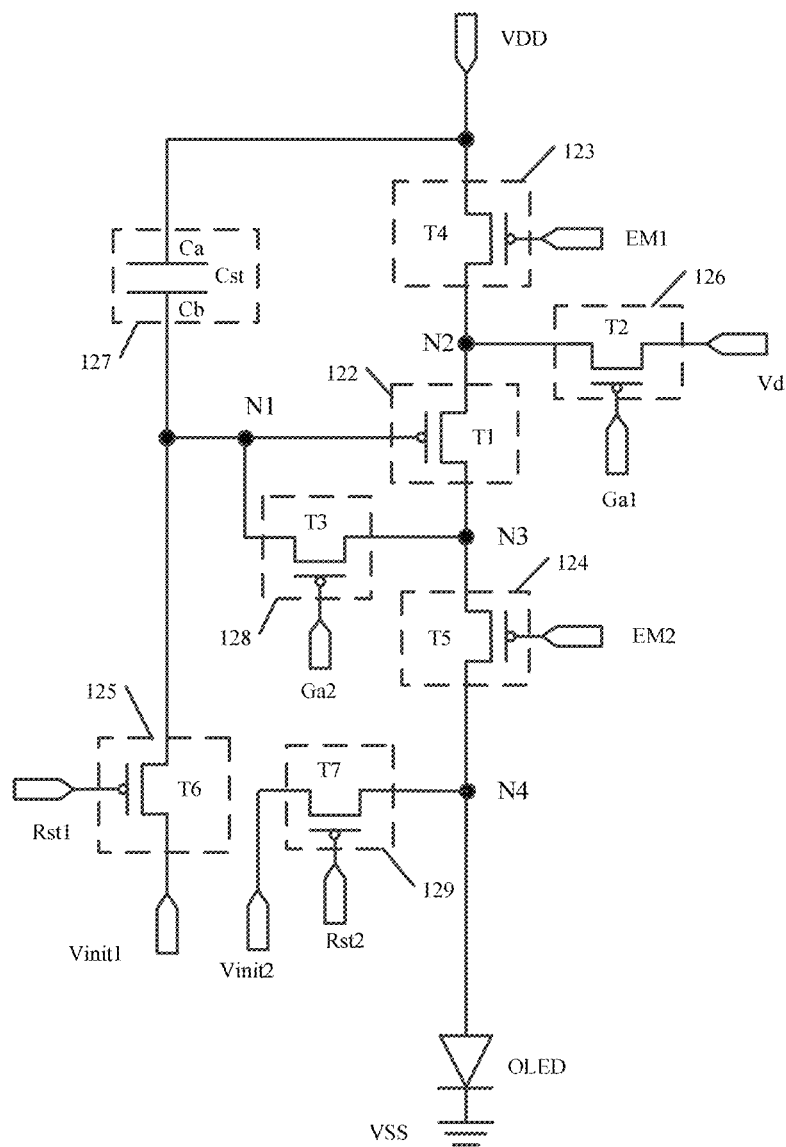
FIG. 2A is another one pixel circuit diagram in a display substrate provided by at least one embodiment of the present disclosure.

FIG. 2A is a circuit diagram of a specific implementation example of the pixel circuit as illustrated in FIG. 1B. As illustrated in FIG. 2A, the pixel circuit includes a first to seventh transistors T1, T2, T3, T4, T5, T6, T7, as well as a storage capacitor Cst. For example, the first transistor T1 is used as a drive transistor, and the second to seventh transistors are used as switch transistors.

For example, as illustrated in FIG. 2A, the drive sub-circuit 122 may be implemented as the first transistor T1. The gate of the first transistor T1 serves as the control terminal 122a of the drive sub-circuit 122 and is connected to the first node N1. The first pole of the first transistor T1 serves as the first terminal 122b of the drive sub-circuit 122 and is connected to the second node N2. The second pole of the first transistor T1 serves as the second terminal 122c of the drive sub-circuit 122 and is connected to the third node N3.

For example, as illustrated in FIG. 2A, the data writing sub-circuit 126 may be implemented as the second transistor T2. The gate of the second transistor T2 is connected to the first scan line (the first scan signal terminal Ga1) to receive the first scan signal. The first pole of the second transistor T2 is connected to the data line (the data signal terminal Vd) to receive the data signal. The second pole of the second transistor T2 is connected to the first terminal 122b (the second node N2) of the drive sub-circuit 122.

For example, as illustrated in FIG. 2A, the compensation sub-circuit 128 may be implemented as the third transistor T3. The gate, the first pole, and the second pole of the third transistor T3 serve as the control electrode 128a, the first electrode 128b, and the second electrode 128c of the compensation sub-circuit, respectively. The gate of the third transistor T3 is configured to be connected to the second scan line (the second scan signal terminal Ga2) to receive the second scan signal. The first pole of the third transistor T3 is connected to the second terminal 122c (the third node N3) of the drive sub-circuit 122. The second pole of the third transistor T3 is connected to the control terminal 122a (the first node N1) of the drive sub-circuit 122. For example, as illustrated in FIG. 2A, the storage sub-circuit 127 may be implemented as the storage capacitor Cst. The storage capacitor Cst includes a first capacitor electrode Ca and a second capacitor electrode Cb. The first capacitor electrode Ca is coupled, for example, electrically connected, to the first voltage terminal VDD. The second capacitor electrode Cb is coupled, for example, electrically connected, to the control terminal 122a of the drive sub-circuit 122.

For example, as illustrated in FIG. 2A, the first light-emitting control sub-circuit 123 may be implemented as the fourth transistor T4. The gate of the fourth transistor T4 is connected to the first light-emitting control line (the first light-emitting control terminal EM1) to receive the first light-emitting control signal. The first pole of the fourth transistor T4 is connected to the first voltage terminal VDD to receive the first power supply voltage. The second pole of the fourth transistor T4 is connected to the first terminal 122b (the second node N2) of the drive sub-circuit 122.

For example, the light-emitting element 120 is specifically implemented as a light-emitting diode (LED), such as an organic light-emitting diode (OLED), a quantum dot light-emitting diode (QLED), or an inorganic light-emitting diode. For example, the light-emitting element 120 may be a micro light-emitting diode (Micro LED) or a micro OLED. For example, the light-emitting element 120 may be a top emission structure, a bottom emission structure, or a double-sided emission structure. The light-emitting element 120 can emit red light, green light, blue light or white light, and etc. The embodiments of the present disclosure do not limit the specific structure of the light-emitting element.

For example, the first electrode 134 (for example, an anode) of the light-emitting element 120 and the fourth node N4 are configured to be connected to the second terminal 122c of the drive sub-circuit 122 through the second light-emitting control sub-circuit 124. The second electrode 135 (for example, a cathode) of the light-emitting element 120 is configured to be connected to the second voltage terminal VSS to receive the second power supply voltage VSS. The current that flows from the second terminal 122c of the drive sub-circuit 122 into the light-emitting element 120 determines the brightness of the light-emitting element 120. For example, the second voltage terminal can be grounded, that is, VSS can be 0 V. For example, the second power supply voltage VSS may be a negative voltage.

For example, the second light-emitting control sub-circuit 124 may be implemented as the fifth transistor T5. The gate of the fifth transistor T5 is connected to the second light-emitting control line (the second light-emitting control terminal EM2) to receive the second light-emitting control signal. The first pole of the fifth transistor T5 is connected to the second terminal 122c (the third node N3) of the drive sub-circuit 122. The second pole of the fifth transistor T5 is connected to the first terminal 134 (the fourth node N4) of the light-emitting element 120.

For example, the first reset sub-circuit 125 may be implemented as the sixth transistor T6, and the second reset sub-circuit is implemented as the seventh transistor T7. The gate of the sixth transistor T6 is configured to be connected to the first reset control terminal Rst1 to receive the first reset control signal Rst1. The first pole of the sixth transistor T6 is connected to the first reset voltage terminal Vinit1 to receive the first reset voltage Vinit1. The second pole of the sixth transistor T6 is configured to be connected to the first node N1. The gate of the seventh transistor T7 is configured to be connected to the second reset control terminal Rst2 to receive the second reset control signal Rst2. The first pole of the seventh transistor T7 is connected to the second reset voltage terminal Vinit2 to receive the second reset voltage Vinit2. The second pole of the seventh transistor T7 is configured to be connected to the fourth node N4.

It is to be noted that each of the transistors used in the embodiments of the present disclosure may be a thin film transistor or a field effect transistor or other switching device with the same characteristics. In the embodiments of the present disclosure, a thin film transistor is used as an example for description. The source and drain of the transistor used herein may be symmetrical in structure, and thus there may be no difference in structure between the source and drain of the transistor. In the embodiments of the present disclosure, to distinguish the two poles of the transistor except the gate, one pole is directly described as the first pole and the other pole is directly described as the second pole.

In addition, transistors can be divided into N-type and P-type transistors according to their characteristics. When the transistor is a P-type transistor, the turn-on voltage is a low-level voltage (for example, 0V, −5V, −10V, or other suitable voltages), and the turn-off voltage is a high-level voltage (for example, 5V, 10V, or other suitable voltages). When the transistor is an N-type transistor, the turn-on voltage is a high-level voltage (for example, 5V, 10V, or other suitable voltages), and the turn-off voltage is a low-level voltage (for example, 0V, −5V, −10V, or other suitable voltages). For example, as illustrated in FIG. 1B, the first to seventh transistors T1-T7 are all P-type transistors, such as low-temperature polysilicon thin film transistors. However, the embodiments of the present disclosure do not limit the type of the transistors. If the type of the transistors changes, connection relationships in the circuit will be adjusted accordingly.

Figure 2B:
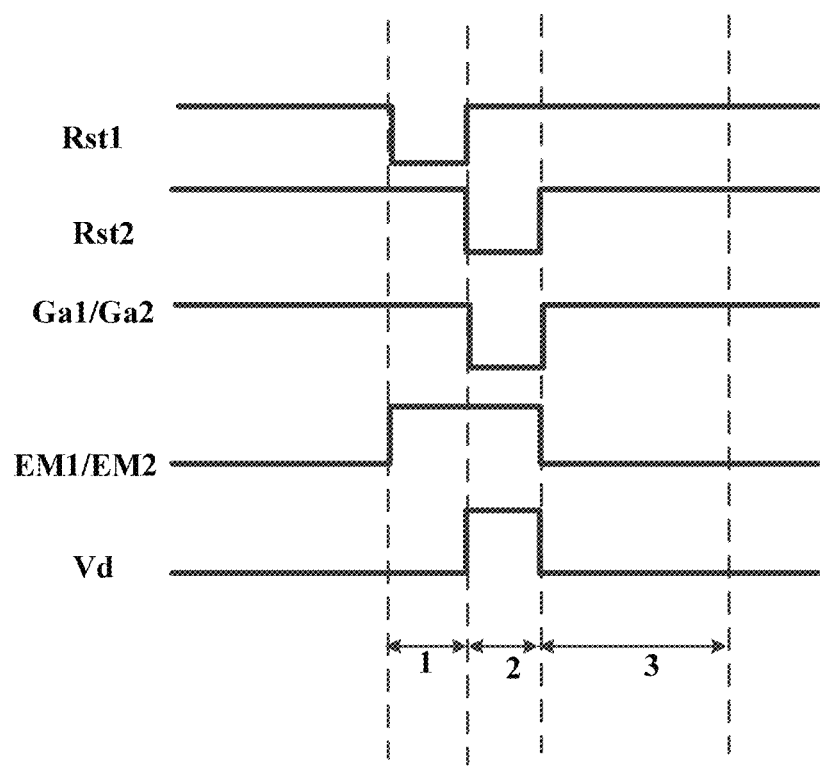
FIG. 2B is a timing signal diagram of a pixel circuit provided by at least one embodiment of the present disclosure.

Working principle of the pixel circuit as illustrated in FIG. 2A will be described below with reference to the signal timing diagram as illustrated in FIG. 2B. As illustrated in FIG. 2B, the display process of each frame of image includes three stages, namely, an initialization stage 1, a data writing and compensation stage 2, and a light-emitting stage 3.

As illustrated in FIG. 2B, in the present embodiment, a same signal is used as the first scan signal Ga1 and the second scan signal Ga2, and a same signal is used as the first light-emitting control signal EM1 and the second light-emitting control signal EM2. And, the second reset control signal Rst2 and the first scan signal Ga1/the second scan signal Ga2 have the same waveform, that is to say, a same signal may be used as the second reset control signal Rst2, the first scan signal Ga1/the second scan signal Ga2. The first reset signal Rst1 of the sub-pixels in the current row has the same waveform as the first scan signal Ga1/the second scan signal Ga2 of the sub-pixels in the previous row, that is, the same signal is used. However, this is not a limitation to the present disclosure. In other embodiments, different signals may be used as the first scan signal Ga1, the second scan signal Ga2, the first reset control signal Rst1, and the second reset control signal Rst2, respectively, and different signals may be used as the first light-emitting control signal EM1 and the second light-emitting control signal EM2, respectively.

In the initialization stage 1, the first reset control signal Rst1 is input to turn on the sixth transistor T6, and the first reset voltage Vinit1 is applied to the gate of the first transistor T1, thereby resetting the first node N1.

In the data writing and compensation stage 2, the first scan signal Ga1, the second scan signal Ga2, and the data signal Vd are input, and the second transistor T2 and the third transistor T3 are turned on. The data signal Vd is written into the second node N2 by the second transistor T2, and the first node N1 is charged through the first transistor T1 and the third transistor T3, until the first transistor T1 is turned off when a potential of the first node N1 changes to Vd+Vth, where Vth is a threshold voltage of the first transistor T1. The potential of the first node N1 is stored in the storage capacitor Cst to be retained, that is to say, voltage information including the threshold voltage Vth and the data signal is stored in the storage capacitor Cst for subsequent use in the light-emitting stage to provide gray display data and compensate the threshold voltage of the first transistor T1 itself.

In the data writing and compensation stage 2, the second reset control signal Rst2 can be further input to turn on the seventh transistor T7, and the second reset voltage Vinit2 is applied to the fourth node N4, thereby resetting the fourth node N4. For example, the reset of the fourth node N4 may also be performed in the initialization stage 1. For example, the first reset control signal Rst1 and the second reset control signal Rst2 may be identical. The embodiments of the present disclosure do not limit this.

In the light-emitting stage 3, the first light-emitting control signal EM1 and the second light-emitting control signal EM2 are input to turn on the fourth transistor T4, the fifth transistor T5, and the first transistor T1, and the fifth transistor T5 applies a drive current to the OLED to make it emit light. The value of the drive current I flowing through the OLED can be obtained according to the following formula:

I=K (VGS−Vth)2=K [(Vdata+Vth−VDD)−Vth]2=K (Vdata−VDD)2, wherein K is the conductivity of the first transistor.

In the above formula, Vth represents the threshold voltage of the first transistor T1, VGS represents a voltage between the gate and source (herein, the first pole) of the first transistor T1, and K is a constant value related to the first transistor T1 itself. It can be seen from the above calculation formula of I that the drive current I flowing through the OLED is no longer related to the threshold voltage Vth of the first transistor T1, as a result of which the compensation of the pixel circuit can be achieved, thereby solving the problem of threshold voltage offset of the drive transistor (the first transistor T1 in the embodiments of the present disclosure) due to the process and long-term operation thereof, and eliminating its impact on the drive current I, so that the display effect of the display device using it can be improved.

Hereinafter, the structure of the display substrate provided by at least one embodiment of the present disclosure will be exemplarily described, by using the pixel circuit as illustrated in FIG. 2A as an example, and with reference to FIGS. 3A-3B, FIGS. 4A-4B, FIG. 5A-FIG. 5D, FIG. 6A-FIG. 6B and FIGS. 7A-7B.

Figure 3A:
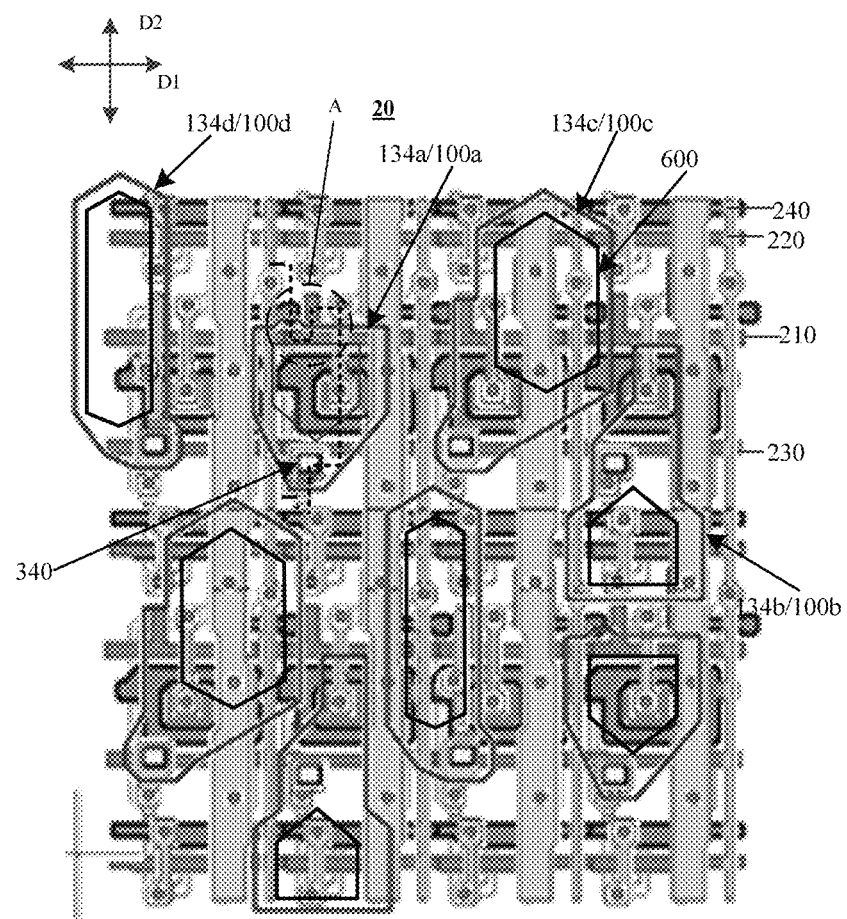
FIG. 3A is another schematic view of a display substrate provided by at least one embodiment of the present disclosure.
Figure 3B:
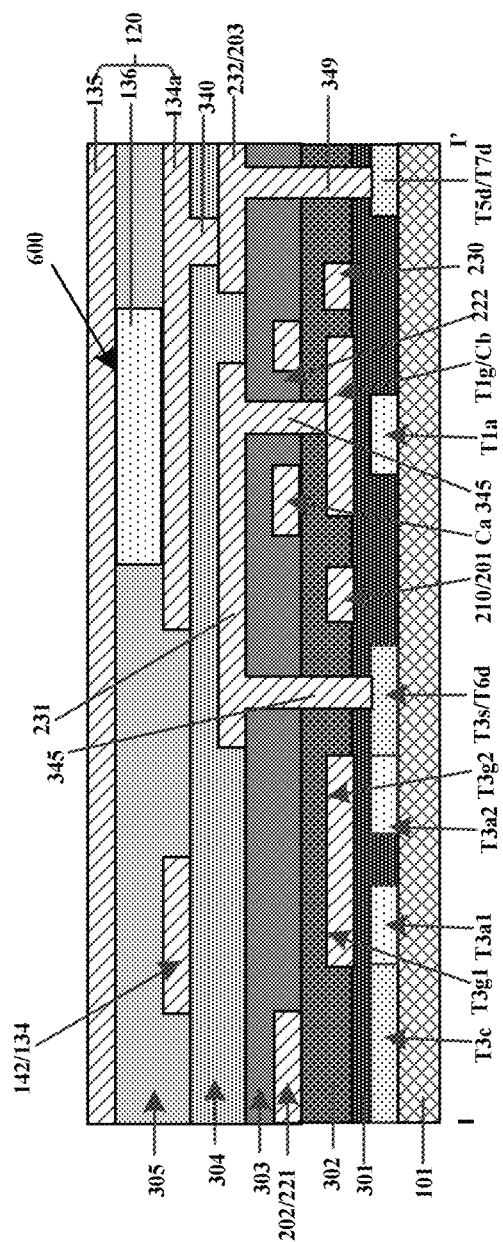
FIG. 3B is a cross-sectional view of FIG. 3A along the section line I-I'.
Figure 5A:
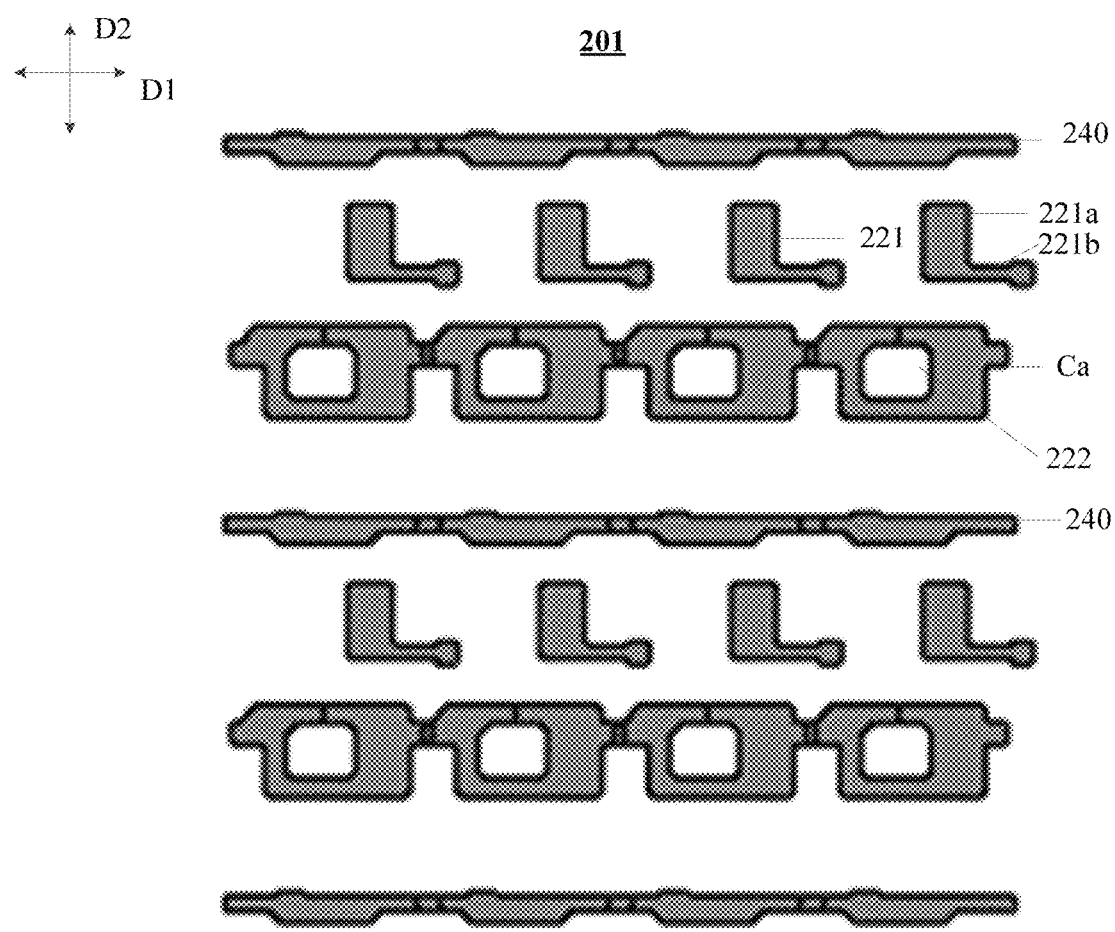
FIG. 5A is still yet another schematic view of a display substrate provided by at least one embodiment of the present disclosure.

FIG. 3A is a schematic diagram of a display substrate 20 provided by at least one embodiment of the present disclosure, and FIG. 3B is a cross-sectional view of FIG. 5A taken along the section line I-I'. It is to be noted that, for the sake of clarity, some structures that do not have a direct electrical connection relationship at the section line are omitted in FIG. 3B.

As illustrated in FIG. 3A, the display substrate 20 includes a base substrate 101 on which a plurality of sub-pixels 100 are located. Pixel circuits of the plurality of sub-pixels 100 are arranged as a pixel circuit array. The column direction of the pixel circuit array is the first direction D1, while the row direction is the second direction D2. The first direction D1 and the second direction D2 intersect each other, and for example, the first direction D1 and the second direction D2 are orthogonal to each other. In some embodiments, the first direction D1 may be the row direction, and the second direction D2 may be the column direction. In some embodiments, each of the pixel circuits of sub-pixels may have completely the same structure except for the connection structure with the light-emitting element, that is, the pixel circuits are repeatedly arranged in the row and column directions, and the connection structures of the various sub-pixels with the light-emitting element may vary according to the arrangement shape and position of the electrode of the light-emitting structure of the respective sub-pixel. In some embodiments, the general outlines, such as the shape and position of each signal line, of the pixel circuits of the sub-pixels of different colors, are substantially identical, and the relative positional relationships of the various transistors are also substantially identical. However, there may be differences in width and shape of some signal lines or connecting lines, or in channel size and shape of some transistors, or in connecting lines or via hole positions used to connect to the light-emitting elements of different sub-pixels, which can be adjusted according to the respective layout structures and sub-pixel arrangements.

FIG. 3A schematically illustrates four sub-pixels (i.e., a first sub-pixel 100a, a second sub-pixel 100b, a third sub-pixel 100c, and a fourth sub-pixel 100d) that are directly adjacent to each other in a row of sub-pixels. The embodiments of the present disclosure are not limited to this layout.

For example, the first sub-pixel 100a, the second sub-pixel 100b, the third sub-pixel 100c, and the fourth sub-pixel 100d are configured to emit green light, green light, blue light, and red light, respectively. The first sub-pixel 100a, the second sub-pixel 100b, the third sub-pixel 100c, and the fourth sub-pixel 100d constitute a repeating unit of the display substrate 20. With reference to FIGS. 3A-3B, a semiconductor layer 102, a first insulating layer 301, a first conductive layer 201, a second insulating layer 302, a second conductive layer 202, a third insulating layer 303, a third conductive layer 203, a fourth insulating layer 304, and a fourth conductive layer 204 are sequentially disposed on the base substrate 101, to form the structure of the display substrate as illustrated in FIG. 3A.

Figure 4A:
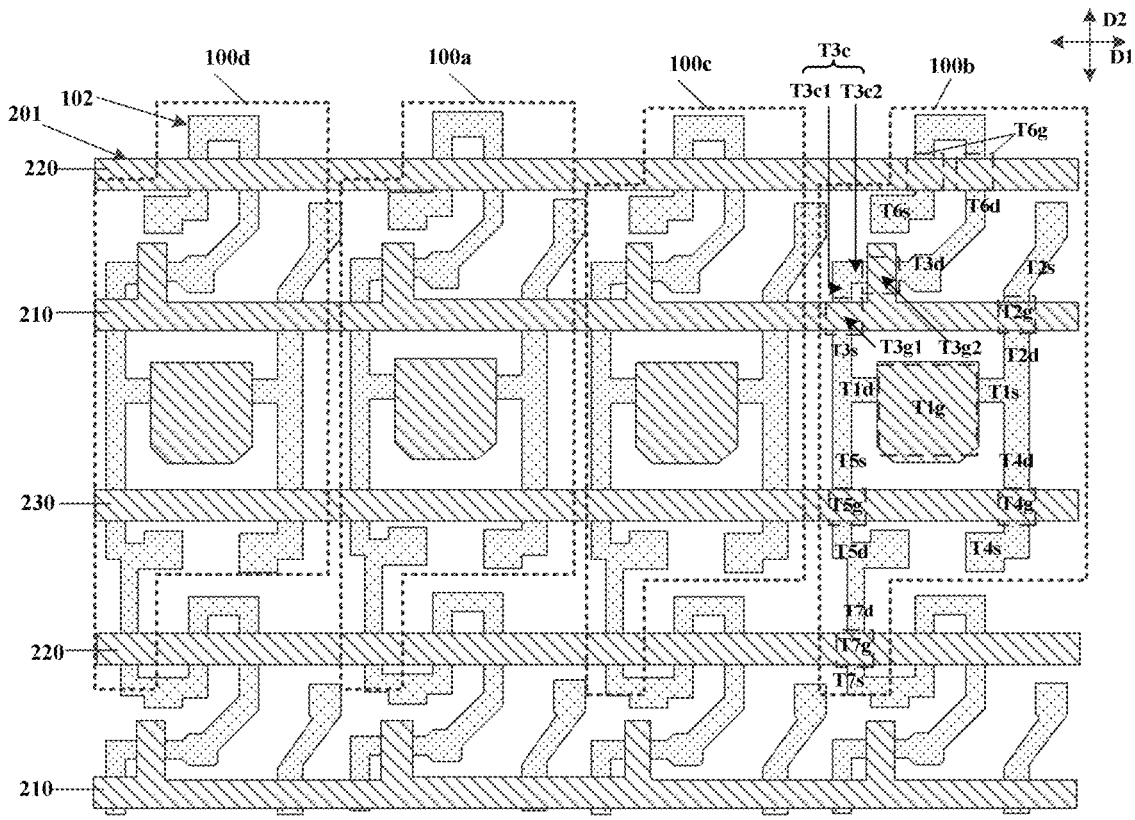
FIG. 4A is yet another schematic view of a display substrate provided by at least one embodiment of the present disclosure.
Figure 5B:
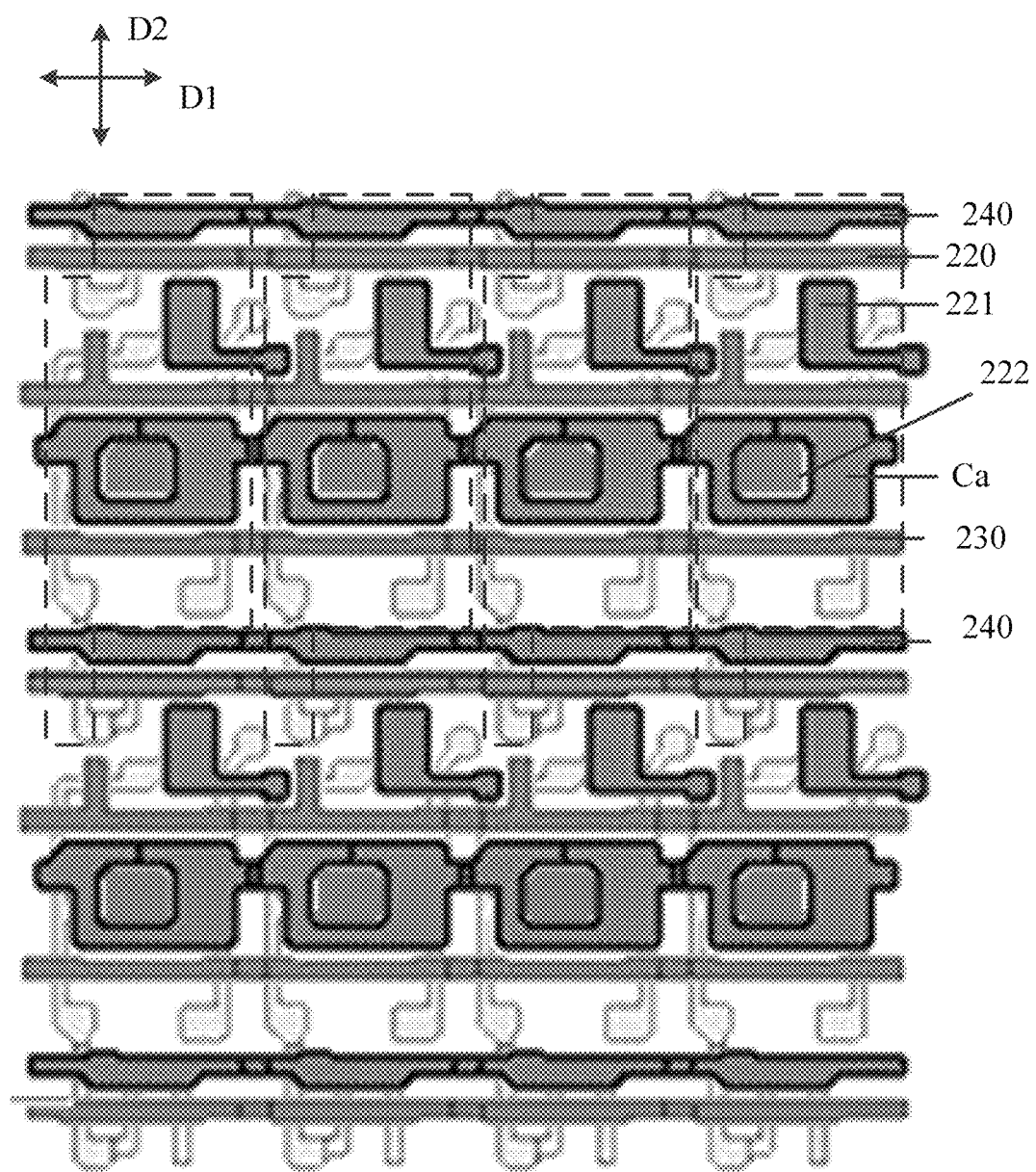
FIG. 5B is yet another schematic view of a display substrate provided by at least one embodiment of the present disclosure.
Figure 6A:
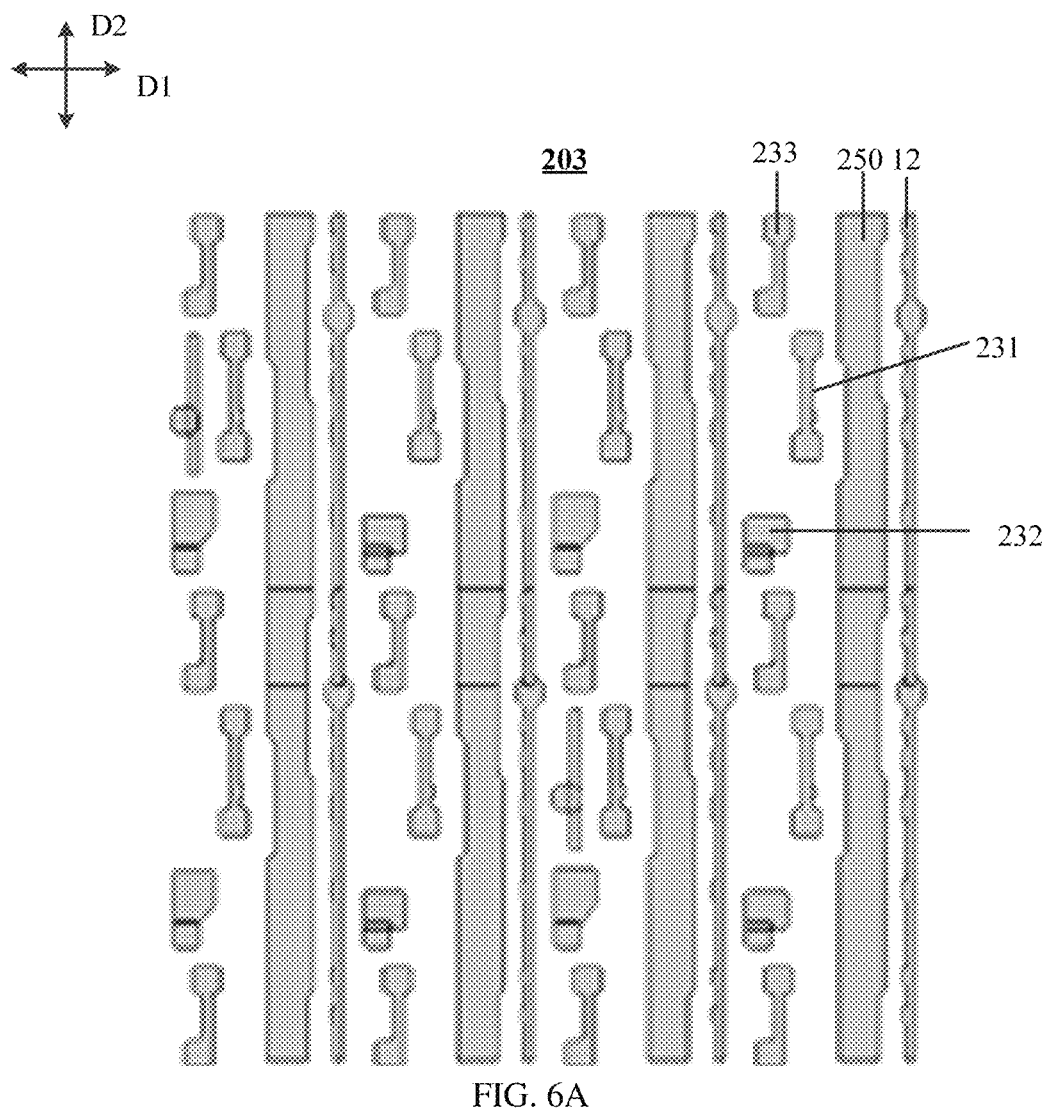
FIG. 6A is still yet another schematic view of a display substrate provided by at least one embodiment of the present disclosure.
Figure 6B:
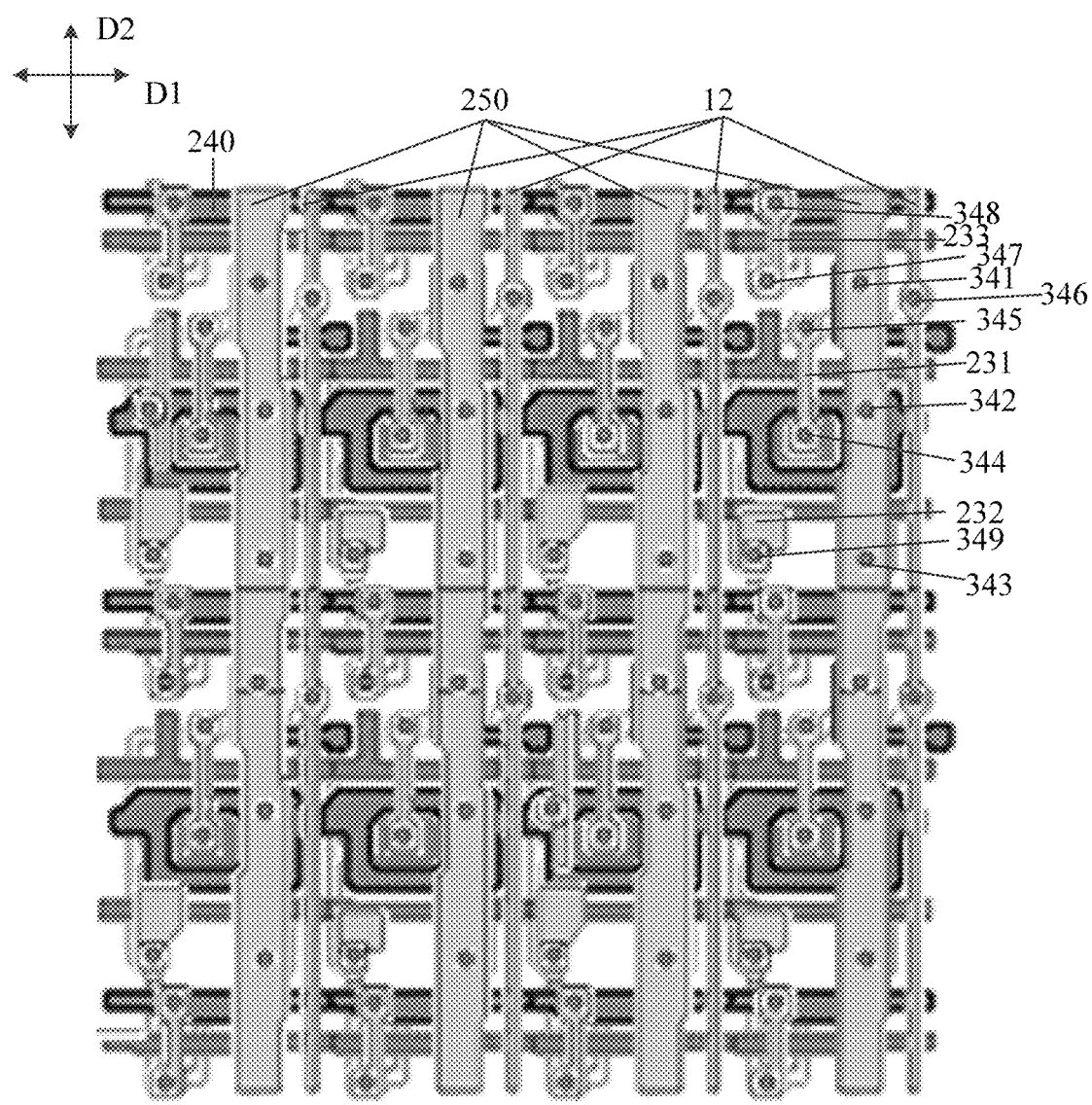
FIG. 6B is still yet another schematic view of a display substrate provided by at least one embodiment of the present disclosure.
Figure 7A:
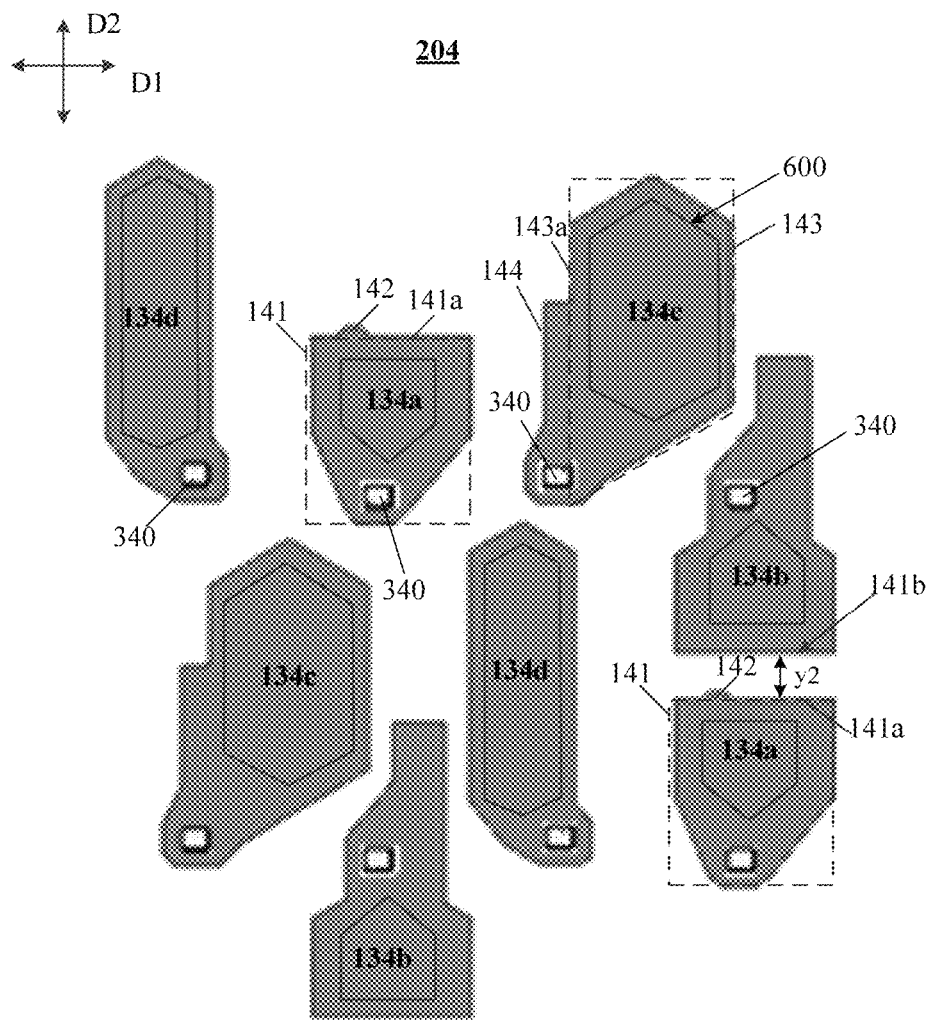
FIG. 7A is another schematic view of a display substrate provided by at least one embodiment of the present disclosure.
Figure 7B:
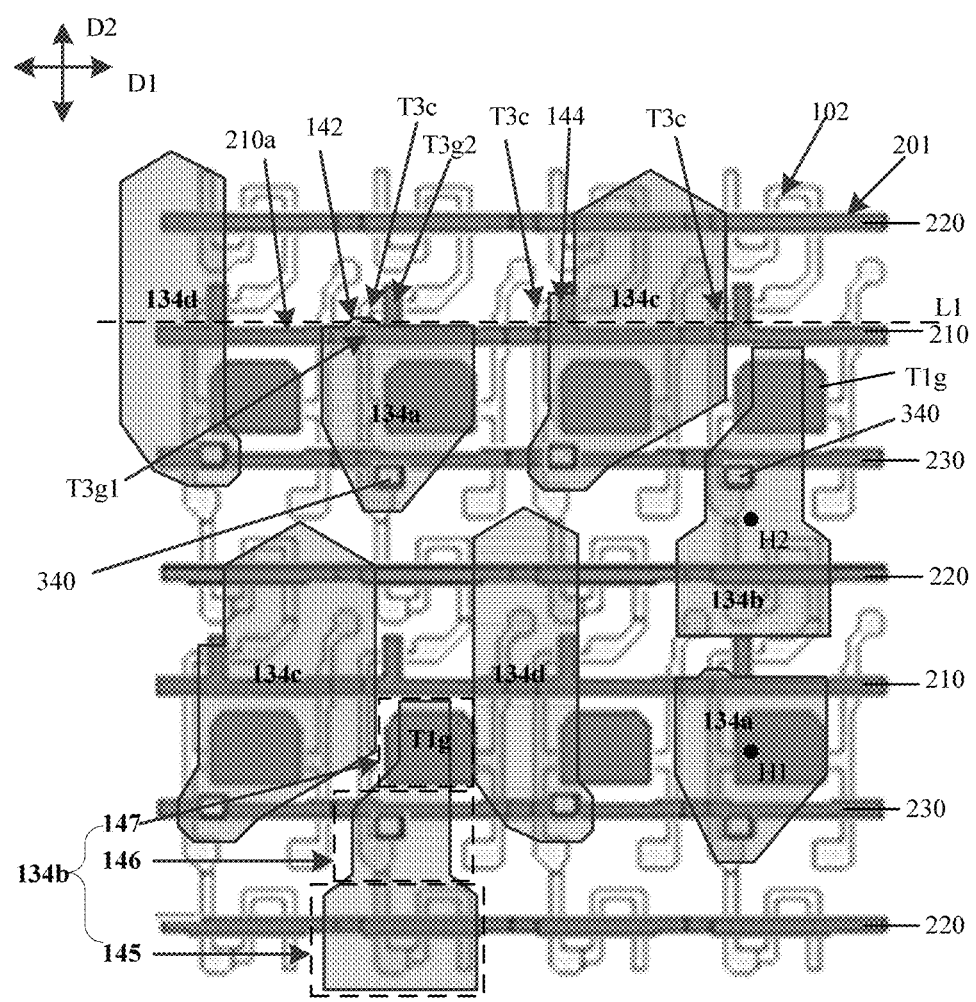
FIG. 7B is yet another schematic view of a display substrate provided by at least one embodiment of the present disclosure.

FIG. 4A corresponds to FIG. 3A and illustrates the semiconductor layer 102 and the first conductive layer (gate layer) 201 of the transistors T1-T7 in the four sub-pixels 100. FIG. 5A illustrates the second conductive layer 202, FIG. 5B illustrates the second conductive layer 202 on the basis of FIG. 4A. FIG. 6A illustrates the third conductive layer 203, and FIG. 6B illustrates the third conductive layer 203 on the basis of FIG. 5B. FIG. 7A illustrates the fourth conductive layer 204, and FIG. 7B illustrates the semiconductor layer 102, the first conductive layer 201, and the fourth conductive layer 204.

To facilitate making an explanation, in the following description, Tng, Tns, Tnd, and Tna are used to denote the gate, the first pole, the second pole, and the channel region of the n-th transistor Tn, where n is 1 to 7.

It is to be noted that "(arranged) in the same layer" in the present disclosure refers to a structure formed by two (or more than two) structures formed by a same deposition process and patterned by a same patterning process, and the materials thereof may be the same or different. The "integral structure" in the present disclosure refers to an interconnected structure formed by two (or more than two) structures that are formed by the same deposition process and patterned by the same patterning process, and the materials thereof may be the same or different.

For example, as illustrated in FIG. 4A, the first conductive layer 201 includes the gate of each transistor and some scan lines and control lines. FIG. 4A illustrates areas where the pixel circuit of each sub-pixel 100 is located by large dashed frames, and FIG. 4A illustrates the gates T1g-T7g of the first to seventh transistors T1-T7 in one sub-pixel 100 by small dashed frames.

The semiconductor layer 102 includes active layers T1a-T7a of the first to seventh transistors T1-T7. As illustrated in FIG. 3A, the active layers T1a-T7a of the first to seventh transistors T1-T7 are connected to each other as an integral structure. For example, the semiconductor layers 20 in each column of sub-pixels are of an integral structure in which the semiconductor layers 20 are connected to each other, and the semiconductor layers in two adjacent columns of sub-pixels are spaced apart from each other.

For example, as illustrated in FIG. 4A, the first conductive layer 201 includes the gates T1g-T7g of the first to seventh transistors T1-T7. For example, the display substrate 20 adopts a self-aligning process, and the first conductive layer 201 is used as a mask to conduct a conductive treatment (for example, doping treatment) on the semiconductor layer 102, so that a portion of the semiconductor layer 102 which is not covered by the first conductive layer 201 is made conductive, such that the portions of the active layer of each transistor located on two sides of the channel region are made conductive to form the first pole and the second pole of the transistor.

Figure 4B:
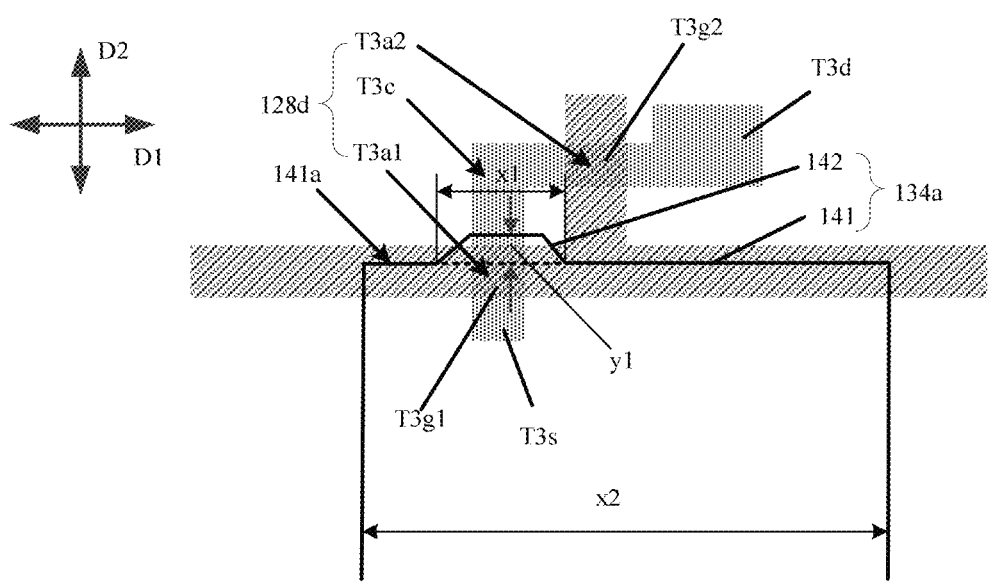
FIG. 4B is yet another schematic view of a display substrate provided by at least one embodiment of the present disclosure.

FIG. 4B illustrates an enlarged schematic view of the area A of the first sub-pixel 100a in FIG. 3A. As illustrated in FIG. 4B, the first drive electrode 134a of the light-emitting element of the first sub-pixel 100a includes a first main body portion 141 and a first protruding portion 142. In FIG. 4B, a line dividing the first main body portion 141 and the first protruding portion 142 is shown by a dotted line. The first main body portion includes a first side 141a parallel to a certain direction. For example, the first side 141a is a straight side parallel to the first direction D1. The first protruding portion 142 protrudes from the first side 141a of the first main body portion 141.

As illustrated in FIGS. 4A-4B, the compensation sub-circuit of the first sub-pixel 100a further includes a connection portion 128d which is located between a first electrode thereof (i.e., the first pole T3s of the third transistor T3) and a second electrode thereof (i.e., the second pole T3d of the third transistor T3) and connects the first electrode with the second electrode. The first protruding portion 142 at least partially overlaps with the connection portion 128d of the compensation sub-circuit of the first sub-pixel 100a in the direction perpendicular to the base substrate 101.

For example, as illustrated in FIG. 4B, the connection portion 128d includes a first semiconductor region T3a1, a conductive region T3c, and a second semiconductor region T3a2. The first semiconductor region T3a1 separates the first electrode of the compensation sub-circuit from the conductive region T3c. The second semiconductor region T3a2 separates the second electrode of the compensation sub-circuit from the conductive region T3a2. That is to say, the first pole T3s, the first semiconductor region T3a1, the conductive region T3c, the second semiconductor region T3a2, and the second pole T3d of the third transistor T3 are sequentially connected.

For example, as illustrated in FIGS. 4A-4B, the connection portion, the first electrode, and the second electrode of the compensation sub-circuit are located on the same semiconductor layer 102 and are of an integral structure. That is to say, the first pole T3s, the first semiconductor region T3a1, the conductive region T3c, the second semiconductor region T3a2, and the second pole T3d of the third transistor T3 are an integral structure in the same semiconductor layer 102, and for example, they all include polysilicon material.

For example, the third transistor T3 and the sixth transistor T6 adopt a double gate structure, which can improve the gate control capability of the transistor and reduce the leakage current. Because the third transistor T3 and the sixth transistor T6 are transistors directly connected to the gate of the first transistor T1 (i.e., the drive transistor), the stability of the third transistor T3 and the sixth transistor T6 directly affects the voltage stability at the gate (N1 node) of the first transistor T1. The double-gate structure is adopted to improve the gate control capability of the third transistor T3 and the sixth transistor T6, which helps to reduce the leakage current of the transistors and thus helps to maintain the voltage at the N1 node. In this way, in the compensation stage, the threshold voltage of the first transistor T1 can be fully compensated, thereby improving the display uniformity of the display substrate in the light-emitting stage.

For example, as illustrated in FIGS. 4A-4B and FIGS. 3A-3B, the gate of the third transistor T3 includes a first gate T3g1 and a second gate T3g2. The first semiconductor region T3a1, the second semiconductor region T3a2, the conductive region T3c, the first pole T3s, and the second pole T3d are located in the same semiconductor layer 102 and are integrally formed, and are made to have different conductive properties by selectively conductive treatments (for example, ion implantation).

The first semiconductor region and the second semiconductor region are respectively blocked by the first gate T3g1 and the second gate T3g2, and thus are not shown in FIG. 4A. That is to say, an orthographic projection of the first semiconductor region T3a1 on the base substrate 101 is located within an orthographic projection of the first gate T3g1 on the base substrate 101, and an orthographic projection of the second semiconductor region T3a2 on the base substrate 101 is located within an orthographic projection of the second gate T3g2 on the base substrate 101. The conductive region T3c does not overlap with both the first gate T3g1 and the second gate T3g2 in the direction perpendicular to the base substrate.

For example, as illustrated in FIG. 4B, for the first sub-pixel 100a, at least portions of both the first semiconductor region T3a1 and the first gate T3g1 of the third transistor T3 at least partially overlap with the first electrode of the light-emitting element in the direction perpendicular to the base substrate 101. In other words, in the direction perpendicular to the base substrate 101, at least a part of the first gate T3g1 which overlaps with the first semiconductor region T3a1 of the third transistor T3 is blocked by the first electrode of the light-emitting element. This will be described in detail later when discussing the fourth conductive layer where the first electrode of the light-emitting element is located.

The inventors have found that when light irradiates on the gate of the transistor, an offset will happen in the threshold voltage. In the embodiments of the present disclosure, the first electrode of the light-emitting element of the first sub-pixel is provided to block at least a part of the gate of the third transistor (the compensation transistor), which improves the stability of the compensation transistor and thus the display uniformity.

For example, as illustrated in FIG. 4B, a ratio of an area where the first semiconductor region T3a1 of the compensation sub-circuit of the first sub-pixel overlaps with the first electrode 134 of the light-emitting element 120 of the first sub-pixel in the direction perpendicular to the base substrate 101 to the area of the first semiconductor region T3a1 is 50%-100%. That is to say, the first electrode 134 of the light-emitting element 120 may completely cover the first semiconductor region T3a1.

For example, as illustrated in FIG. 4B, the first protruding portion 142 of the first electrode 134 of the light-emitting element 120 at least partially overlaps with the conductive region T3c and the first semiconductor region T3a1 of the compensation sub-circuit, respectively, in the direction perpendicular to the base substrate 101.

In some other examples, in the direction perpendicular to the base substrate 101, the first protruding portion 142 of the first electrode 134 of the light-emitting element 120 may only overlap with the first semiconductor region T3a1 without overlapping with the conductive region T3c.

In some other examples, the first protruding portion 142 of the first electrode 134 of the light-emitting element 120 may not overlap with the first semiconductor region T3a1 of the compensation sub-circuit in the direction perpendicular to the base substrate 101. In this case, for example, the main body portion 141 of the first electrode 134 completely covers the first semiconductor region T3a1 of the compensation sub-circuit. For example, the projections of the first side 141a of the main body portion 141 of the first electrode 134 and the side of the first gate T3g1 adjacent to the conductive region T3c on the base substrate 101 coincide with each other.

For example, in the second direction D2, a maximum of y1 dimension of the first protruding portion 142 is smaller than an average dimension of the first gate T3g1 of the compensation sub-circuit.

For example, in the second direction D2, the maximum dimension y1 of the first protruding portion 142 is less than 3 microns, for example, less than 2 microns, and for example, between 1 micron and 2 microns.

For example, the first protruding portion 142 is located between the first gate T3g1 and the second gate T3g2, and does not overlap with the second gate T3g2 in the direction perpendicular to the base substrate.

For example, as illustrated in FIG. 4B, an orthographic projection of the first electrode 134 of the light-emitting element on the base substrate 101 is divided into two parts by the orthographic projection of the first grid T3g1 on the base substrate 101. That is to say, the orthographic projection of the first electrode 134 of the light-emitting element on the base substrate 101 includes a first portion and a second portion located on two sides of the orthographic projection of the first gate T3g1 on the base substrate 101 in the second direction D2. The first portion at least partially overlaps with an orthographic projection of the conductive region T3c of the compensation sub-circuit on the base substrate. The area S1 of the first portion is less than 1/10 of the total area of the orthographic projection S2 of the first electrode of the light-emitting element on the base substrate 101. For example, S1 is less than 1/20 of S2. For example, when the first protruding portion 142 does not overlap with the conductive region T3c, the area S1 of the first portion may be zero.

For example, as illustrated in FIG. 4B, in the first direction D1, a maximum dimension x1 of the first protruding portion 142 is 1/8-1/3, for example 1/6-1/4, of a maximum dimension x2 of the first electrode 134 of the light-emitting element. For example, in the first direction D1, the maximum dimension x1 of the first protruding portion 142 is between 5 microns and 10 microns, for example, 6 microns.

For example, as illustrated in FIGS. 4A-4B, the conductive region T3c is L-shaped and includes a first branch T3c1 and a second branch T3c2. The first branch T3c1 extends in the second direction D2 and is directly connected to the first semiconductor region T3a1 of the compensation sub-circuit. The second branch T3c2 extends in the first direction D1 and is directly connected to the second electrode of the compensation sub-circuit, namely, the second semiconductor region T3a2 of the third transistor T3.

For example, the first conductive layer 104 further includes a plurality of gate lines 11 insulated from each other. The gate lines 11 include, for example, a plurality of scan lines 210, a plurality of reset control lines 220, and a plurality of light-emitting control lines 230. Herein, the gate lines 11 refer to signal lines directly connected to the gates of the transistors to provide scan signals or control signals. For example, each row of sub-pixels is respectively connected to one scan line 210, two reset control lines 220, and one light-emitting control line 230.

The scan line 210 is electrically connected to (or integrally formed with) the gates of the second transistors T2 in the corresponding row of sub-pixels to provide the first scan signals Ga1. The reset control line 220 is electrically connected to the gates of the sixth transistors T6 in the corresponding row of sub-pixels to provide the first reset control signals Rst1. The light-emitting control line 230 is electrically connected to the gates of the fourth transistors T4 in the corresponding row of sub-pixels to provide the first light-emitting control signals EM1.

For example, as illustrated in FIG. 4A, the scan line 210 is also electrically connected to the gate of the third transistor T3 to provide the second scan signal Ga2. That is to say, the first scan signal Ga1 and the second scan signal Ga2 may be the same signal. The light-emitting control line 230 is also electrically connected to the gate of the fifth transistor T5 to provide the second light-emitting control signal EM2. That is to say, the first light-emitting control signal EM1 and the second light-emitting control signal EM2 are the same signal.

For example, the first gate T3g1 extends in the first direction D1 and is a part of the scan line 210. The second gate T3g2 extends in the second direction D2 and is an extension part of the scan line 210 in the second direction D2.

For example, as illustrated in FIG. 4A, the gate of the seventh transistor T7 of the pixel circuit of the current row is electrically connected to the reset control line 220 corresponding to the pixel circuit of the next row (that is, according to the scanning sequence of the scan line, the pixel circuit row where a scan line sequentially turned on after the scan line of the current row is located) to receive the second reset control signal Rst2.

For example, as illustrated in FIGS. 5A-5B, the second conductive layer 202 includes a first capacitor electrode Ca. The first capacitor electrode Ca overlaps with the gate T1g of the first transistor T1 in the direction perpendicular to the base substrate 101 to form a storage capacitor Cst. That is, the gate T1g of the first transistor T1 serves as the second capacitor electrode Cb of the storage capacitor Cst. For example, the first capacitor electrode Ca includes an opening 222 that exposes at least part of the gate T1g of the first transistor T1, so that the gate T1g is electrically connected to other structures. For example, the first capacitor electrodes Ca of the sub-pixels located in the same pixel row are connected to each other as an integral structure.

For example, the second conductive layer 202 may further include a plurality of reset voltage lines 240 extending in the first direction D1. The plurality of reset voltage lines 240 are correspondingly connected to a plurality of rows of sub-pixels one by one. The reset voltage line 240 is electrically connected to the first pole of the sixth transistor T6 in the corresponding row of sub-pixels to provide the first reset voltage Vinit1.

For example, as illustrated in FIG. 5B, the first pole of the seventh transistor T7 in the sub-pixels of the current row is electrically connected to the reset voltage line 240 corresponding to the next row of sub-pixels to receive the second reset voltage Vinit2. This will be described in detail later with reference to FIG. 6B.

For example, as illustrated in FIG. 5B, the second conductive layer 202 may further include a shield electrode 221. For example, the shield electrode 221 overlaps with the first pole T2s of the second transistor T2 in the direction perpendicular to the base substrate 101 so as to protect the signal in the first pole T2s of the second transistor T2 from being interfered with other signals. Since the first pole T2s of the second transistor T2 is configured to receive the data signal Vd which determines the display gray scale of the sub-pixel, the shield electrode 221 improves the stability of the data signal, thereby improving the display performance.

For example, referring to FIG. 5B and FIG. 4A, the shield electrode 221 also at least partially overlaps with the second pole T6d of the sixth transistor T6 in the direction perpendicular to the base substrate 101 to improve the stability of the signal in the second pole T6d and thus the stability of the sixth transistor T6, as a result, the gate voltage of the first transistor T1 is further stabilized.

For example, referring to FIG. 5B and FIG. 4A, the shield electrode 221 also extends to the adjacent sub-pixel and at least partially overlaps with the conductive region T3c of the third transistor T3 in the adjacent sub-pixel in the direction perpendicular to the base substrate 101, so as to improve the stability of the signal in the conductive region T3c and thus the stability of the third transistor T3, as a result, the gate voltage of the first transistor T1 is further stabilized.

For example, referring to FIG. 4B, in the direction perpendicular to the base substrate 101, the overlapping area of the conductive region T3c of the compensation sub-circuit of the first sub-pixel and the first protruding portion 142 is less than the overlapping area of the conductive region T3c of the compensation sub-circuit of the first sub-pixel and the shield electrode 221.

For example, the shield electrode 221, and the first pole T2s of the second transistor T2, or the conductive region T3c of the third transistor T3, or the second pole T6d of the sixth transistor T6, which directly faces (overlaps with) the shield electrode 221, form a stable capacitor. The shield electrode 221 is configured to be loaded with a fixed voltage. Because the voltage difference across the capacitor cannot change abruptly, the voltage stability of the first pole T2s of the second transistor T2, the conductive region T3c of the third transistor T3, and the second pole T6d of the sixth transistor T6 are improved. For example, the shield electrode 221 is electrically connected to the power line 250 in the third conductive layer so that the first power voltage VDD is loaded.

For example, as illustrated in FIGS. 5A-5B, the shield electrode 221 is L-shaped and includes a first branch 221a and a second branch 22b that extend in different directions. The first branch 221a at least partially overlaps with the second pole T6d of the sixth transistor T6 in the direction perpendicular to the base substrate 101. The second branch 221b at least partially overlaps with the first pole T2s of the second transistor T2 and the conductive region T3c of the third transistor T3 in the adjacent sub-pixel in the direction perpendicular to the base substrate 101. For example, the first branch 221a extends in the second direction D2, and the second branch 22b extends in the first direction D1. That is, in the direction perpendicular to the base substrate, the shield electrode 121 overlapping with the conductive region T3c of the compensation sub-circuit of the first sub-pixel 100a is a shield electrode in the sub-pixel adjacent to the first sub-pixel 100a in the first direction D1 and near a side of the compensation sub-circuit thereof.

Figure 5C:
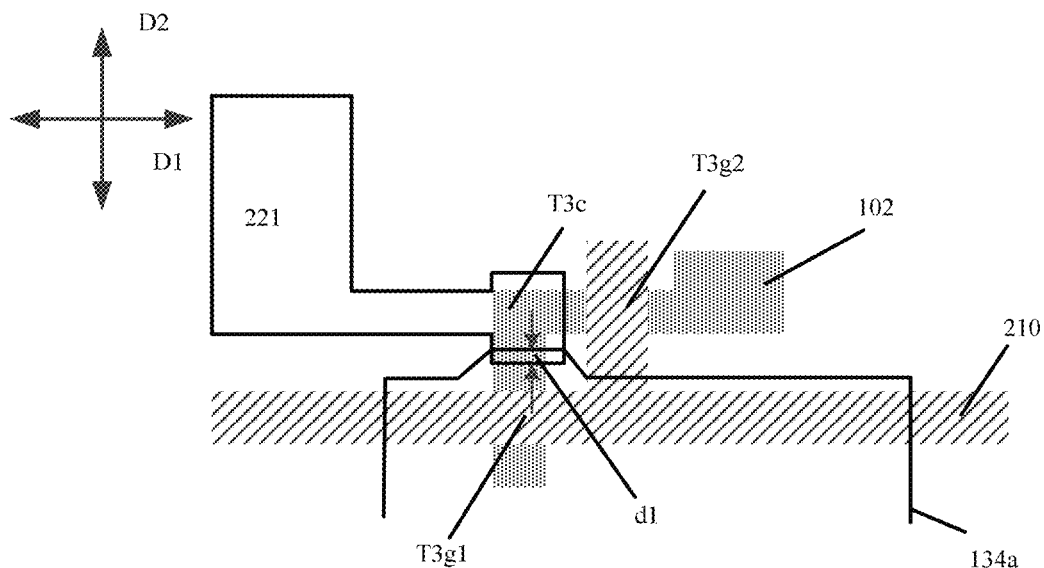
FIG. 5C is an enlarged schematic view of the area A in FIG. 3A.

FIG. 5C illustrates an example of an enlarged schematic view of the area A in FIG. 3A. As illustrated in FIG. 5C, in the direction perpendicular to the base substrate, the shield electrode 221 does not overlap with the first gate T3g1 and the second gate T3g2 of the third transistor T3, thereby avoiding generation of parasitic capacitance and affecting the gate signals.

For example, as illustrated in FIG. 5C, in the direction perpendicular to the base substrate, the shield electrode 221 at least partially overlaps with the light-emitting element 134 of the first sub-pixel 100a, and an average overlapping dimension d1 in the second direction D2 is 0.1 micron to 1 micron, for example, 0.1 micron to 0.5 micron.

Figure 5D:
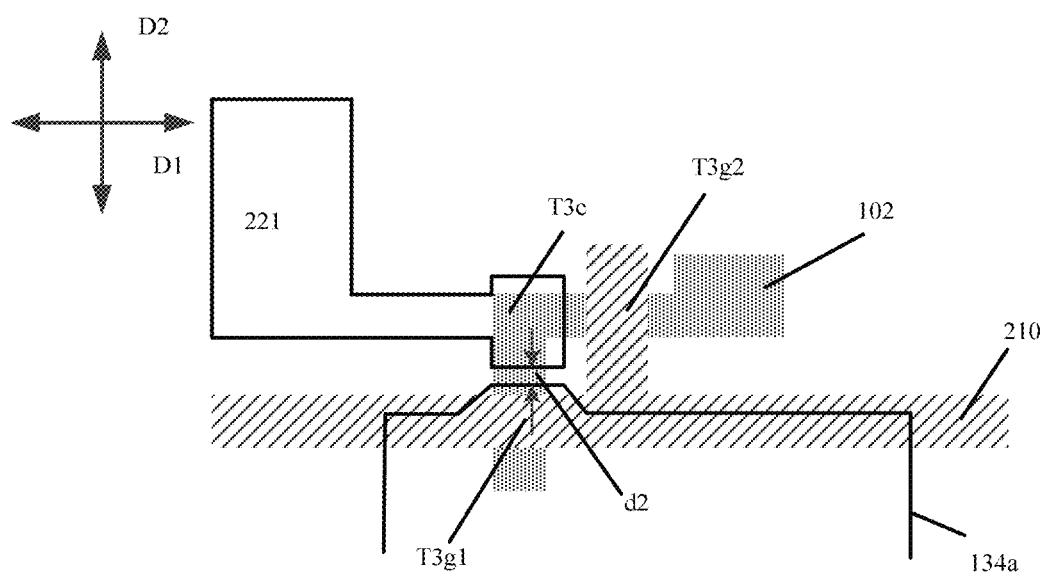
FIG. 5D is another enlarged schematic view of the area A in FIG. 3A.

FIG. 5D illustrates another example of an enlarged schematic view of the area A in FIG. 3A. As illustrated in FIG. 5D, in the direction perpendicular to the base substrate, the shield electrode 221 does not overlap with the light-emitting element 134 of the first sub-pixel 100a and a gap is presented between the shield electrode 221 and the light-emitting element 134 of the first sub-pixel 100a. An average dimension d2 of the gap in the second direction D2 is 0.1 micron to 1 micron, for example, 0.1 micron to 0.5 micron.

For example, as illustrated in FIGS. 6A-6B, the third conductive layer 203 includes a plurality of power lines 250 extending in the second direction D2. For example, the plurality of power lines 250 are electrically connected to a plural columns of sub-pixels one by one in a corresponding manner to provide the first power voltage VDD. The power line 250 is electrically connected to the first capacitor electrode Ca in the corresponding column of sub-pixels through a via hole 342, and is electrically connected to the first pole of the fourth transistor T4 through a via hole 343. For example, the power line 250 is also electrically connected to the shield electrode 221 through a via hole 341, so that the shield electrode 221 has a fixed potential, which improves the shielding ability of the shield electrode. For example, the via hole 342 and the via hole 341 each penetrate through the third insulating layer 303, and the via hole 343 penetrates through the first insulating layer 301, the second insulating layer 302, and the third insulating layer 303.

For example, the third conductive layer 203 further includes a plurality of data lines 12 extending in the second direction D2. For example, the plurality of data lines 12 are electrically connected to the plural columns of sub-pixels one by one in a corresponding manner to provide data signals. For example, the data line 12 is electrically connected to the first pole T2s of the second transistor T2 in the corresponding column of sub-pixels through a via hole 346 to provide the data signals. For example, the via hole 346 penetrates through the first insulating layer 301, the second insulating layer 302, and the third insulating layer 303.

For example, as illustrated in FIGS. 3A-3B, and FIGS. 6A-6B, the third conductive layer 203 further includes a first connecting electrode 231. One end of the first connecting electrode 231 is electrically connected to the gate T1g of the first transistor T1, namely, the second capacitor electrode Cb, through the opening 222 in the first capacitor electrode Ca and a via hole 344 in the insulating layer, and the other end of the first connecting electrode 231 is electrically connected to the first pole of the third transistor T3 through a via hole 345, so that the second capacitor electrode Cb is electrically connected to the first pole T3s of the third transistor T3. For example, the via hole 344 penetrates through the second insulating layer 302 and the third insulating layer 303. For example, the via hole 345 penetrates through the first insulating layer 301, the second insulating layer 302, and the third insulating layer 303.

For example, as illustrated in FIGS. 3A-3B, and FIGS. 6A-6B, the third conductive layer 203 further includes a second connecting electrode 232. The second connecting electrode 233 is electrically connected to the second pole T5d of the fifth transistor T5 through a via hole 349, and is configured to electrically connect the second pole T5d of the fifth transistor T5 to the first electrode 134 of the light-emitting element. For example, the via hole 349 penetrates through the first insulating layer 301, the second insulating layer 302, and the third insulating layer 303. This will be described in detail later.

For example, as illustrated in FIGS. 6A-6B, the third conductive layer 203 further includes a third connecting electrode 233. One end of the third connecting electrode 233 is electrically connected to the reset voltage line through a via hole 348, and the other end of the third connecting electrode 233 is electrically connected to the sixth transistor T6 through a via hole 347, so that the first pole T6s of the sixth transistor T6 can receive the first reset voltage Vinit1 from the reset voltage line 240. For example, the via hole 348 penetrates through the third insulating layer 303. For example, the via hole 404 penetrates through the first insulating layer 301, the second insulating layer 302, and the third insulating layer 303.

For example, as illustrated in FIG. 6B, the first pole of the seventh transistor T7 in the sub-pixels of the previous row is electrically connected to the reset voltage line 240 corresponding to the current row of sub-pixels to receive the second reset voltage Vinit2. The first pole of the seventh transistor T7 in the sub-pixels of the current row is electrically connected to the reset voltage line 240 corresponding to the next row of sub-pixels to receive the second reset voltage Vinit2.

FIG. 7A illustrates a schematic view of the fourth conductive layer 204. To facilitate the description of the relative positional relationship between the first electrode of the light-emitting element and the gate and channel regions of the respective transistors in the embodiments of the present disclosure, FIG. 7B illustrates the semiconductor layer 102, the first conductive layer 201, and the fourth conductive layer 204.

As illustrated in FIGS. 3A-3B and FIGS. 7A-7B, the fourth conductive layer 204 includes the first electrode 134 of the light-emitting element, for example, the first electrode 134 includes the first electrode 134a of the first sub-pixel 100a, the first electrode 134b of the second sub-pixel 100b, the first electrode 134c of the third sub-pixel 100c, and the first electrode 134d of the fourth sub-pixel 100d. The first electrode 134 of each sub-pixel is electrically connected to the second connecting electrode 232 in the sub-pixel through a via hole 340, and thus is electrically connected to the second pole T5d of the fifth transistor T5 through the second connecting electrode 233. The via hole 340 penetrates through the fourth insulating layer 304, for example.

For example, referring to FIGS. 3A-3B, the display substrate 20 may further include a pixel defining layer 305 on the first electrode of the light-emitting element. An opening is formed in the pixel defining layer 305 and exposes at least part of the first electrode 134 so as to define an opening area (i.e., an effective light-emitting area) 600 of each sub-pixel of the display substrate. The light-emitting layer 136 of the light-emitting element 120 is formed at least in the opening (the light-emitting layer 136 may also cover a part of the surface of a side of the pixel defining layer away from the first electrode of the light-emitting element). The second electrode 135 is formed on the light-emitting layer 136 to form the light-emitting element 120. For example, the second electrode 135 is a common electrode, and has its entire surface arranged in the display substrate 20. For example, the first electrode 134 is an anode of the light-emitting element, and the second electrode 135 is a cathode of the light-emitting element.

FIG. 7A illustrates the position of the opening area 600 on the first electrode of the light-emitting element of each sub-pixel, and illustrates the position of the via hole 340 of the pixel electrode relative to the corresponding first electrode 134. As illustrated in FIG. 7A, orthographic projections of the via hole 340 and the opening area 600 on the base substrate 101 do not overlap with each other. That is to say, the orthographic projection of the via hole 340 on the base substrate 101 is outside the opening area 600. In the direction perpendicular to the base substrate 101, the via hole 340 is relatively close to the light-emitting layer 136. Such arrangement prevents the via hole 340 from affecting the flatness of the light-emitting layer in the opening area and affecting the light-emitting quality.

For example, as illustrated in FIG. 3B, the via hole 349 and the via hole 340 partially but not completely overlap or do not overlap in the direction perpendicular to the base substrate 101, so as to avoid stacking of via holes in the direction perpendicular to the substrate which leads to poor connection, disconnection, or unevenness at positions of the via holes. In some other examples, the via hole 349 and the via hole 340 do not overlap in the direction perpendicular to the base substrate 101. In some examples, a via hole penetrating through a certain layer may be formed to have a dimension on one surface of the film layer greater than a dimension on the opposite surface. The range of the via hole size may be the largest size that can be formed in the corresponding film layer.

Referring to FIG. 3B and FIG. 7B, the first semiconductor region T3a1 of the compensation sub-circuit (i.e., the third transistor T3) of the first sub-pixel 100a at least partially overlaps with the first electrode 134a of the light-emitting element of the first sub-pixel in the direction perpendicular to the base substrate 101. By providing the first electrode 134a to block the first semiconductor region T3a1 in the direction perpendicular to the base substrate 101, at least a part of the first gate T3g1 above the first semiconductor region T3a1 can be blocked by the first electrode 134a, thereby avoiding instability, such as threshold offset, of the third transistor T3 caused by the first semiconductor region and the first gate being exposed to light, and thereby improving the stability of the voltage on the control electrode of the drive sub-circuit, and thereby improving the display uniformity of the substrate.

For example, an area of the first semiconductor region T3a1 overlapping with the first electrode 134a in the direction perpendicular to the base substrate 101 is 20%-100%, for example 50%-100%, of a total area of the first semiconductor region T3a1.

For example, as illustrated in FIG. 3B and FIG. 7B, in the direction perpendicular to the base substrate 101, the first electrode 134a of the light-emitting element of the first sub-pixel also at least partially overlaps with the conductive region T3c of the third transistor T3 of the first sub-pixel, so as to increase the area of the first gate T3g1 of the third transistor T3 that is blocked by the first electrode 134a as much as possible. For example, an orthographic projection of the first gate T3g1 on the base substrate 101 is within an orthographic projection of the first electrode 134a on the base substrate 101. For example, the first gate T3g1 herein refers to a part of the scan line 210 that overlaps with the first semiconductor region T3a1 in the direction perpendicular to the base substrate 101.

For example, as illustrated in FIG. 7B, in the second direction D2, an orthographic projection of the first protruding portion 142 of the first sub-pixel 100a on the base substrate 101 and the via hole 340 corresponding to the first sub-pixel 100a are respectively located on two sides of the orthographic projection of the control electrode T1g of the drive sub-circuit of the first sub-pixel 100a on the base substrate 101.

For example, as illustrated in FIGS. 7A-7B, the first electrode 134a of the light-emitting element of the first sub-pixel includes a first main body portion 141 and a first protruding portion 142. The first main body portion 141 includes a first side 141a parallel to the first direction D1. The first protruding portion 142 protrudes or extends from the first side in the second direction D2. For example, the first protruding portion 142 at least partially overlaps with the conductive region T3c of the third transistor T3 in the direction perpendicular to the base substrate. That is to say, the first protruding portion 142 is disposed corresponding to the conductive region T3c.

For example, referring to FIG. 7A, the first electrode 134b of the light-emitting element of the second sub-pixel 100b and the first electrode 134a of the light-emitting element of the first sub-pixel 100a are arranged side by side in the second direction D2. The first electrode 134b of the light-emitting element of the second sub-pixel includes a second side 141b substantially parallel to and opposite to the first side 141a. The first side 141a is an approximately straight line part of the side of the first electrode 134a near the first electrode 134b of the light-emitting element of the second sub-pixel. That is to say, the part of the protruding portion is not parallel to the second side 141b of the first electrode 134b.

For example, referring to FIG. 4B and FIG. 7A, the maximum dimension y1 of the first protruding portion 142 of the compensation sub-circuit of the first sub-pixel in the second direction D2 is less than ⅓ of a spacing y2 between the first side 141a and the second side 141b, so as to leave enough process margin to ensure that the first electrode of the first sub-pixel and the first electrode of the second sub-pixel are insulated from each other.

The pixel circuit of the first sub-pixel 100a and the pixel circuit of the second sub-pixel 100b are arranged side by side in the second direction D2, that is, the pixel circuit of the first sub-pixel 100a and the pixel circuit of the second sub-pixel 100b are located in different rows. For example, the opening area 600 of the first sub-pixel 100a and the opening area 600 of the second sub-pixel 100b are substantially symmetrical with respect to a symmetry axis along the first direction D1.

For example, as illustrated in FIG. 7B, the first semiconductor region T3a1 of the compensation sub-circuit of the second sub-pixel 100b does not overlap with the first electrode 134b of the light-emitting element of the second sub-pixel 100b in the direction perpendicular to the base substrate 101. For example, as illustrated in FIG. 7B, the first electrode 134b of the light-emitting element of the second sub-pixel 100b is extended to at least partially overlap with the control electrode T1g of the drive sub-circuit of the second sub-pixel in the direction perpendicular to the base substrate, and the first electrode 134b of the light-emitting element of the second sub-pixel 100b does not overlap with the scan line 210 connected to the second sub-pixel in the direction perpendicular to the base substrate.

For example, as illustrated in FIG. 7B, a first center point H1 of the orthographic projection of the first electrode 134a of the light-emitting element of the first sub-pixel 100a on the base substrate is located between the orthographic projection of the scan line 210 connected to the first sub-pixel 100a on the base substrate and the orthographic projection of the light-emitting control line 230 connected to the first sub-pixel 100a on the base substrate.

For example, as illustrated in FIG. 7B, the first center point H1 of the orthographic projection of the first electrode 134a of the light-emitting element of the first sub-pixel 100a on the base substrate and a second center point H2 of the orthographic projection of the first electrode 134b of the light-emitting element of the second sub-pixel 100b on the base substrate are respectively located on two sides of the orthographic projection of the scan line 210 connected to the first sub-pixel on the base substrate in the second direction D2. The first center point H1 is closer to the orthographic projection of the scan line 210 on the base substrate than the second center point H2.

The first center point H1 herein refers to the geometric center of the orthographic projection of the first electrode 134a of the light-emitting element of the first sub-pixel 100a on the base substrate, and the second center point H2 refers to the geometric center of the orthographic projection of the first electrode 134b of the light-emitting element of the second sub-pixel 100b on the base substrate.

As illustrated in FIG. 7B, because the first sub-pixel 100a and the second sub-pixel 100b are not located in the same pixel row, but in the adjacent pixel rows, the scan line 210 connected to the first sub-pixel 100a is not connected to the second sub-pixel 100b.

For example, as illustrated in FIG. 3A, in the direction perpendicular to the base substrate, the scan line 210 connected to the first sub-pixel 100a overlaps with both the opening area 600 of the third sub-pixel 100c and the opening area 600 of the fourth sub-pixel 100d that are in the same row with the first sub-pixel.

Due to limited equipment or process capabilities, a certain process margin is to be left between traces or via holes to ensure process reliability. For example, the spacing between adjacent traces or electrodes is required to be greater than or equal to the minimum dimension that satisfies the Design Rule in the manufacturing process of the display substrate 20, so that the process yield can be ensured. The Design Rule is related to the process capability of the equipment, the manufacturing process, the depth of via hole and the thickness of material layer.

For example, the distance between the first side 141a and the second side 141b is a minimum dimension that satisfies the Design Rule of the display substrate 20, thereby effectively increasing the pixel density.

In this way, the protruding portion 142 is optionally arranged corresponding to the conductive region T3c, which can ensure the process margin and improve the process yield. For example, as illustrated in FIG. 7B, the protruding portion 142 does not overlap with the second semiconductor region T3a2 of the third transistor of the first sub-pixel in the direction perpendicular to the base substrate.

For example, as illustrated in FIG. 7B, the second gate T3g2 of the third transistor T3 extends in the second direction D2 from the first side 210a of the scan line 210 parallel to the first direction D12. For example, the first side 141a of the first electrode 134b overlaps with the first side 210a of the scan line 210 in the direction perpendicular to the base substrate 101. The protruding portion 142 and the second gate T3g2 are located on the same side of the scan line 210. In the second direction D2, the dimension of the protruding portion 142 is less than the dimension of the second gate T3g2. For example, in the second direction D2, the largest dimension of the protruding portion 134 is ⅕-⅓ of the distance between the first side 141a and the second side 141b; and the maximum dimension of the protruding portion 134 is 1/20-1/10 of the maximum dimension of the first electrode 134a.

For example, with reference to FIGS. 7A-7B, the first electrode 134c of the light-emitting element of the third sub-pixel 100c includes a second main body portion 143 and a second protruding portion 144. The main body portion 143 includes a third side 143a parallel to the second direction D2. The second protruding portion 144 protrudes from the third side 143a in the first direction DE The second protruding portion 144 at least partially overlaps with the conductive area T3c of the compensation sub-circuit (namely, the third transistor T3) of the third sub-pixel 100c in the direction perpendicular to the base substrate 101.

For example, as illustrated in FIG. 7B, the first protruding portion 142 of the first sub-pixel 100a at least partially overlaps with the second protruding portion 144 of the adjacent third sub-pixel 100c in the first direction D1. That is to say, a dummy straight line L1 is provided extending in the first direction D1 that intersects the first protruding portion 142 and the second protruding portion 144 at the same time. For example, the dummy straight line L1 overlaps with the second gate T3g2 of the compensation sub-circuit of the first sub-pixel in the direction perpendicular to the base substrate.

For example, the first electrode 134 of the light-emitting element of the third sub-pixel 100c at least partially overlaps with the conductive area T3c of the compensation sub-circuit (i.e., the third transistor T3) of the second sub-pixel 100b in the direction perpendicular to the base substrate 101. The second sub-pixel 100b and the third sub-pixel 100c are adjacent to each other in the first direction DE As illustrated in FIG. 7B, in the first direction D1, the first sub-pixel 100a and the second sub-pixel 100b are located on opposite sides of the third sub-pixel 100c, respectively. For example, as illustrated in FIG. 3A, the orthographic projection of the opening area 600 of the first sub-pixel 100a on the base substrate 101 is located between two power lines 250 (the first power line and the second power line, respectively), and does not overlap or only partially overlaps with the first power line and the second power line in the direction perpendicular to the base substrate 101. This arrangement prevents the power lines 250 from affecting the flatness of the light-emitting layer in the opening area of the first sub-pixel and thus the light-emitting quality (e.g., color cast).

For example, as illustrated in FIG. 3A, the orthographic projection of the center line (passing through a midpoint of the largest dimension in the first direction D2) of the opening area 600 of the third sub-pixel 100c in the second direction D2 on the base substrate 101 is within the orthographic projection of the power line 250 on the base substrate 101. This arrangement makes the position of the power line relatively centered with respect to the opening area 600, thereby avoiding problems, such as color cast, caused by the light-emitting layer in the opening area 600 being inclined to one side due to the arrangement of the power line 250.

For example, as illustrated in FIG. 3A and FIG. 7B, the first electrode 134b of the light-emitting element of the second sub-pixel 100b at least partially overlaps with the control electrode (i.e., the gate T1g of the first transistor T1) of the drive sub-circuit of the second sub-pixel in the direction perpendicular to the base substrate. For example, the first electrode 134b includes a main body portion 145, a connection portion 146, and an extending portion 147. The main body portion 145 is mainly configured to drive the light-emitting layer 136 to emit light. The connection portion 146 is mainly configured to connect to a corresponding pixel circuit. For example, the orthographic projection of the main body portion 145 on the base substrate 101 covers the orthographic projection of the opening area 600 on the base substrate 101. The orthographic projection of the connection portion 146 on the base substrate 101 covers the orthographic projection of the second connecting electrode 232 on the base substrate 101. The extending portion 147 at least partially overlaps with the gate T1g of the first transistor T1 in the direction perpendicular to the base substrate. For example, in the second direction D2, the main body portion 145, the connection portion 146, and the extending portion 147 are arranged in sequence, and the extending portion 147 is farther away from the main body portion 145 than the connection portion 146.

In the embodiments of the present disclosure, the first electrode 134b of the light-emitting element of the second sub-pixel 100b is intentionally extended to form a parasitic capacitor with the gate T1g of the first transistor T1. This is due to the reasons that the first electrodes of the light-emitting elements of the first sub-pixel, the third sub-pixel, and the fourth sub-pixel all at least partially overlap with the gates T1g of the corresponding first transistors T1 in the direction perpendicular to the base substrate. By arranging the second sub-pixel in a similar manner, the uniformity of the display substrate can be improved.

For example, as illustrated in FIG. 7B, in the first direction D1, the average dimensions of the main body portion 145, the connection portion 146, and the extending portion 147 are sequentially reduced. For example, the extending portion 147 is located between the first electrode 134c of the light-emitting element of the third sub-pixel and the first electrode 134d of the light-emitting element of the fourth sub-pixel that are adjacent in the first direction. In order to ensure a process margin, the dimension of the extending portion 147 in the first direction D1 is reduced to be effectively insulated from the first electrodes 134c and 134d. For example, in the first direction D1, a gap between the extending portion 147 and the first electrode 134c of the light-emitting element of the third sub-pixel and a gap between the extending portion 147 and the first electrode 134d of the light-emitting element of the fourth sub-pixel are substantially equal to each other, in which the first electrode 134c of the light-emitting element of the third sub-pixel and the first electrode 134d of the light-emitting element of the fourth sub-pixel are located on the two sides of the extending portion 147. In some examples, the gap is less than 4 microns. In some examples, the gap is less than 3.5 microns. In some examples, the gap is less than 3 microns. In some examples, the gap is less than the gap between the first electrodes of the light-emitting elements of two green sub-pixels.

For example, in order to improve the display resolution, the conventional mode, in which the red, green, and blue sub-pixels define a pixel unit that emits full-color light, may be changed, so that relatively less sub-pixels are used, the same pixel resolution performance capability can be achieved in an analog manner, thereby reducing the difficulty and manufacturing cost of the manufacturing process. For example, by using the differences in resolution of sub-pixels of different colors by human eyes, some sub-pixels of colors that are not sensitive to resolution at certain locations can be shared among different pixels. Because human eyes are most sensitive to the green color, for example, each of red sub-pixels and each of blue sub-pixels can be shared by at least two pixel units, while each pixel unit can independently have one green sub-pixel. Because the blue sub-pixel and the red sub-pixel in each pixel are shared by adjacent pixel units, the pixels in the embodiments of the present invention are not pixels in the strict sense, and instead, the pixels can be called as dummy pixel units.

For example, the first sub-pixel 100a, the second sub-pixel 100b, the third sub-pixel 100c, and the fourth sub-pixel 100d constitute a repeating unit of the display substrate 20.

For example, the light-emitting elements of the first sub-pixel 100a and the second sub-pixel 100b are both green sub-pixels. For example, the third sub-pixel 100c may be a blue sub-pixel, and the fourth sub-pixel 100d may be a red sub-pixel.

For example, as illustrated in FIG. 3A, in the first direction, the opening areas of the third sub-pixel 100c and the fourth sub-pixel 100d are alternately arranged. The opening areas 600 of the first sub-pixel 100a and the second sub-pixel 100b are arranged in pairs side by side in the second direction, and are located between the opening area 600 of the third sub-pixel 100c and the opening area of the fourth sub-pixel 100d in the first direction.

For example, four sub-pixels in each repeating unit may form two dummy pixels, and the third sub-pixel 100c and the fourth sub-pixel 100d in the repeating unit are respectively shared by the two dummy pixels. For example, as illustrated in FIG. 3A, the fourth sub-pixel 100d and the first sub-pixel 100a which is located on the right side of the fourth sub-pixel 100d and is adjacent to the fourth sub-pixel 100d constitute a dummy pixel, and the third sub-pixel 100c in the adjacent (on the right) dummy pixel is used to form a pixel unit. The third sub-pixel 100c and the second sub-pixel 100b which is located on the right side of the third sub-pixel 100c and is adjacent to the third sub-pixel 100c constitute a dummy pixel, and the adjacent fourth sub-pixel 100d (on the right, not shown) is used to form the pixel unit. The sub-pixels in a plurality of repeating units form a pixel array. In the row direction of the pixel array (for example, the first direction), the sub-pixel density is 1.5 times the dummy pixel density, and in the column direction of the pixel array (for example, the second direction), the sub-pixel density is 1.5 times the dummy pixel density. Compared with the conventional RGB arrangement, the pixel arrangement provided by the embodiments of the present disclosure effectively improves the pixel density.

Because each pixel unit individually has one green sub-pixel, the density of green sub-pixels is the highest, and the opening areas of the green sub-pixels are arranged to be relatively small to achieve a high-density pixel distribution. In this case, the area of the pixel electrode of the green sub-pixel may also be relatively small.

In the embodiments of the present disclosure, in a limited area, the first electrode (i.e., the pixel electrode) of the light-emitting element of the green sub-pixel is provided to block the channel region of the compensation sub-circuit and the control electrode corresponding to the channel region, thereby improving the stability of the compensation sub-circuit while realizing high-resolution display, and thus improving the display uniformity of the display substrate.

For example, the base substrate 101 may be a rigid substrate, such as a glass substrate, a silicon substrate, and etc., or may be formed of flexible material with good heat resistance and durability, such as polyimide (PI), polycarbonate (PC), polyethylene terephthalate (PET), polyethylene, polyacrylate, polyarylate, polyetherimide, polyethersulfone, polyethylene glycol terephthalate (PET), polyethylene (PE), polypropylene (PP), polysulfone (PSF), polymethyl methacrylate (PMMA), cellulose triacetate (TAC), cyclic olefin polymer (COP) and cyclic olefin copolymer (COC), and etc.

For example, the material of the semiconductor layer 102 includes, but is not limited to, silicon-based materials (amorphous silicon a-Si, polysilicon p-Si, and etc.), metal oxide semiconductors (IGZO, ZnO, AZO, IZTO, and etc.), and organic materials (hexathiophene, polythiophene, and etc.).

For example, the first to fourth conductive layers may include material, such as gold (Au), silver (Ag), copper (Cu), aluminum (Al), molybdenum (Mo), magnesium (Mg), tungsten (W), and alloy made of combinations of the above metals; or may include conductive metal oxide materials, such as indium tin oxide (ITO), indium zinc oxide (IZO), zinc oxide (ZnO), zinc aluminum oxide (AZO), and etc.

For example, the light-emitting element 120 has a top emission structure, and the first electrode 134 is reflective, while the second electrode 135 is transmissive or semi-transmissive. For example, the first electrode 134 is made of high work function material acting as an anode, and, for example, the first electrode 134 is an ITO/Ag/ITO stack structure. The second electrode 135 is made of low work function material acting as a cathode, such as semi-transmissive metal or metal alloy, for example, Ag/Mg alloy.

For example, the first insulating layer 301, the second insulating layer 302, and the third insulating layer 303 are, for example, inorganic insulating layers, such as insulating layers of oxides of silicon, nitrides of silicon, or oxynitrides of silicon, which are for example, silicon oxide, silicon nitride, silicon oxynitride, and etc., or alumina, titanium nitride and metal oxynitride. For example, the fourth insulating layer 304 and the pixel defining layer 305 are respectively organic insulating materials, such as polyimide (PI), acrylate, epoxy resin, polymethyl methacrylate (PMMA), and etc. For example, the fourth insulating layer 304 is a planarization layer.

Figure 8:
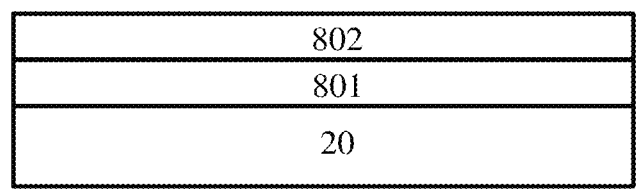
FIG. 8 is a schematic view of a display panel provided by at least one embodiment of the present disclosure.

At least one embodiment of the present disclosure also provides a display panel including any of the above display substrates 20. For example, the display panel is an OLED display panel, and accordingly includes a display substrate 20 which is an OLED display substrate. As illustrated in FIG. 8, for example, the display panel 30 further includes an encapsulation layer 801 and a cover plate 802 disposed on the display substrate 20. The encapsulation layer 801 is configured to seal the light-emitting element on the display substrate 20 to prevent external moisture and oxygen from penetrating into the light-emitting element and the drive sub-circuit and causing damage to the devices. For example, the encapsulation layer 801 includes an organic thin film or includes a structure in which an inorganic thin film, an organic thin film, and an inorganic thin film are alternately stacked. For example, a water absorption layer (not shown) may be further disposed between the encapsulation layer 801 and the display substrate 20. The water absorption layer is configured to absorb residual water vapor or sol left in the previous manufacturing process of the light-emitting element. The cover 802 is, for example, a glass cover or a flexible cover. For example, the cover plate 802 and the encapsulation layer 801 may be an integral structure.

Figure 9:
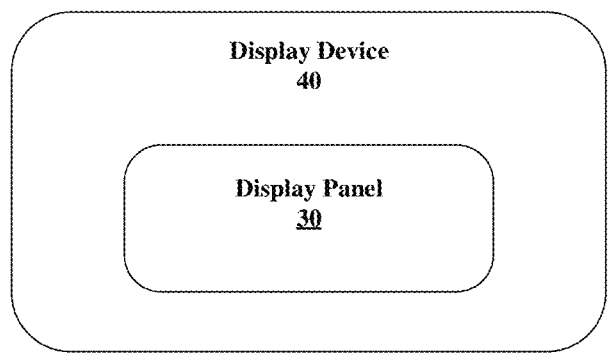
FIG. 9 is a schematic view of a display device provided by at least one embodiment of the present disclosure.

At least one embodiment of the present disclosure also provides a display device 40. As illustrated in FIG. 9, the display device 40 includes any of the above display substrates 20 or display panels 30. The display device in the present embodiment may be: displays, OLED panels, OLED TVs, electronic paper, mobile phones, tablets, laptops, digital photo frames, navigators, and other products or components with display function.

The described above is only the exemplary embodiments of the present invention, and the scope of the present invention is not limited thereto. The scope of the present invention is defined by the claims.

What is claimed is:

1. A display substrate, comprising:
a base substrate; and
a plurality of sub-pixels in an array on the base substrate;
wherein each of the plurality of sub-pixels comprises a pixel circuit and a light-emitting element, the pixel circuit is configured to drive the light-emitting element to emit light, the pixel circuits of the plurality of sub-pixels are arranged in a first direction and in a second direction, and the first direction is different from the second direction;
the pixel circuit comprises a drive sub-circuit and a compensation sub-circuit;
the drive sub-circuit comprises a control electrode, a first terminal, and a second terminal, and is configured to be connected to the light-emitting element and to control a drive current flowing through the light-emitting element;
the compensation sub-circuit comprises a control electrode, a first electrode, and a second electrode, the control electrode of the compensation sub-circuit is configured to receive a scan signal, the first electrode and the second electrode of the compensation sub-circuit are connected to the second terminal and the control electrode of the drive sub-circuit, respectively, and the compensation sub-circuit is configured to perform threshold compensation on the drive sub-circuit in response to the scan signal;
the light-emitting element comprises a first drive electrode, a light-emitting layer, and a second driving electrode which are stacked in sequence, and the first drive electrode of the light-emitting element is located on a side of the light-emitting layer near the base substrate;
the compensation sub-circuit further comprises a connection portion which is located between the first electrode and the second electrode of the compensation sub-circuit and connects the first electrode to the second electrode; and the first electrode, the second electrode, and the connection portion are all located on a same side of the control electrode of the compensation sub-circuit with respect to the base substrate;
the plurality of sub-pixels comprises a first sub-pixel, and a first drive electrode of a light-emitting element of the first sub-pixel comprises a first main body portion comprising a first side parallel to a certain direction and a first protruding portion protruding from the first side of the first main body portion, and the first protruding portion at least partially overlaps with the connection portion of the compensation sub-circuit of the first sub-pixel in a direction perpendicular to the base substrate; the light-emitting element of the first sub-pixel is configured to emit green light;
the first side of the first main body portion is a straight side and is parallel to the first direction, and the protruding portion protrudes from the first side of the first main body portion in the second direction;
the connection portion comprises a first semiconductor region, a conductive region, and a second semiconductor region, the first semiconductor region separates the first electrode of the compensation sub-circuit from the conductive region, and the second semiconductor region separates the second electrode of the compensation sub-circuit from the conductive region; and
the first semiconductor region, the second semiconductor region, the conductive region, the first electrode, and the second electrode of the compensation sub-circuit are located on a same semiconductor layer and are of an integral structure; and
the first protruding portion at least partially overlaps with the conductive region of the compensation sub-circuit of the first sub-pixel in the direction perpendicular to the base substrate.

2. The display substrate according to claim 1, wherein the first drive electrode of the light-emitting element of the first sub-pixel at least partially overlaps with the first semiconductor region of the compensation sub-circuit of the first sub-pixel in the direction perpendicular to the base substrate; and a ratio of an area of the first semiconductor region of the compensation sub-circuit of the first sub-pixel that overlaps with the first drive electrode of the light-emitting element of the first sub-pixel in the direction perpendicular to the base substrate to an area of the first semiconductor region is 50%-100%.

3. The display substrate according to claim 1, further comprising a shield electrode located on a side of the control electrode of the compensation sub-circuit of the first sub-pixel away from the base substrate,
wherein the shield electrode at least partially overlaps with the conductive region of the compensation sub-circuit of the first sub-pixel in the direction perpendicular to the base substrate; and
in the direction perpendicular to the base substrate, an overlapping area between the conductive region of the compensation sub-circuit of the first sub-pixel and the first protruding portion is less than an overlapping area between the conductive region of the compensation sub-circuit of the first sub-pixel and the shield electrode.

4. The display substrate according to claim 1, wherein the conductive region is L-shaped and comprises a first branch and a second branch,
the first branch extends in the second direction and is directly connected to the first semiconductor region of the compensation sub-circuit; and
the second branch extends in the first direction and is directly connected to the second semiconductor region of the compensation sub-circuit.

5. The display substrate according to claim 1, wherein the compensation sub-circuit comprises a compensation transistor having a gate, a first electrode, and a second electrode which serve as the control electrode of the compensation sub-circuit, the first electrode of the compensation sub-circuit, and the second electrode of the compensation sub-circuit, respectively; and
the gate of the compensation transistor comprises a first gate and a second gate, an orthographic projection of the first semiconductor region on the base substrate is located within an orthographic projection of the first gate on the base substrate, an orthographic projection of the second semiconductor region on the base substrate is located within an orthographic projection of the second gate on the base substrate, and the conductive region does not overlap with either the first gate or the second gate in the direction perpendicular to the base substrate.

6. The display substrate according to claim 5, wherein, in the second direction, the first protruding portion has a size less than that of the first gate of the compensation sub-circuit;
an orthographic projection of the first drive electrode of the light-emitting element on the base substrate comprises a first portion and a second portion located on two sides of the orthographic projection of the first gate of the compensation sub-circuit on the base substrate in the second direction, wherein the first portion at least partially overlaps with an orthographic projection of the conductive region of the compensation sub-circuit on the base substrate; and
the first portion has an area less than 1/10 of a total area of the orthographic projection of the first drive electrode of the light-emitting element on the base substrate.

7. The display substrate according to claim 1, wherein, in the first direction, the first protruding portion has a maximum dimension which is 1/8-1/3 of a maximum dimension of the first drive electrode of the light-emitting element; and
in the second direction, the first protruding portion has a maximum dimension of less than 3 microns.

8. The display substrate according to claim 7, wherein the pixel circuit further comprises a first light-emitting control sub-circuit, the first light-emitting control sub-circuit is connected to the first terminal of the drive sub-circuit and a first voltage terminal and is configured to apply a first power supply voltage of the first voltage terminal to the first terminal of the drive sub-circuit in response to a first light-emitting control signal.

9. The display substrate according to claim 8, further comprising a scan line and a light-emitting control line,
wherein the scan line and the light-emitting control line both extend in the first direction,
the scan line is electrically connected to the control electrode of the compensation sub-circuit of the first sub-pixel to provide the scan signal, and the light-emitting control line is connected to the first light-emitting control sub-circuit of the first sub-pixel to provide the first light-emitting control signal.

10. The display substrate according to claim 9, wherein an orthographic projection of the first drive electrode of the light-emitting element of the first sub-pixel on the base substrate has a first center point located between an orthographic projection of the scan line on the base substrate and an orthographic projection of the light-emitting control line on the base substrate.

11. The display substrate according to claim 9, wherein the first center point of the orthographic projection of the first drive electrode of the light-emitting element of the first sub-pixel on the base substrate and a second center point of an orthographic projection of the first drive electrode of the light-emitting element of the second sub-pixel on the base substrate are located on two sides of the orthographic projection of the scan line on the base substrate, respectively, and the first center point is closer to the orthographic projection of the scan line on the base substrate than the second center point.

12. The display substrate according to claim 1, wherein the plurality of sub-pixels further comprise a second sub-pixel, a first drive electrode of a light-emitting element of the second sub-pixel and the first drive electrode of the light-emitting element of the first sub-pixel are arranged side by side in the second direction, and the first drive electrode of the light-emitting element of the second sub-pixel comprises a second side parallel to and opposite to the first side of the first main body portion of the first drive electrode of the light-emitting element of the first sub-pixel.

13. The display substrate according to claim 12, wherein a first protruding portion of the compensation sub-circuit of the first sub-pixel has a maximum dimension in the second direction less than 1/3 of a spacing between the first side and the second side; and
the first semiconductor region of the compensation sub-circuit of the second sub-pixel does not overlap with the first electrode of the light-emitting element of the second sub-pixel in the direction perpendicular to the base substrate.

14. The display substrate according to claim 12, wherein the first drive electrode of the light-emitting element of the second sub-pixel at least partially overlaps with the control electrode of the drive sub-circuit of the second sub-pixel in the direction perpendicular to the base substrate; and
a pixel circuit of the first sub-pixel and a pixel circuit of the second sub-pixel are arranged side by side in the second direction.

15. The display substrate according to claim 1, wherein the plurality of sub-pixels further comprises a third sub-pixel, a first drive electrode of a light-emitting element of the third sub-pixel comprises a second main body portion and a second protruding portion, the second main body portion of the first drive electrode of the light-emitting element of the third sub-pixel comprises a third side parallel to the second direction, the second protruding portion protrudes from the third side in the first direction, the second protruding portion of the first drive electrode of the light-emitting element of the third sub-pixel at least partially overlaps with a conductive region of the compensation sub-circuit of the third sub-pixel in the direction perpendicular to the base substrate.

16. The display substrate according to claim 15, wherein the plurality of sub-pixels further comprises a fourth sub-pixel, which is adjacent to the third sub-pixel in the first direction and is located on a side opposite to the third side of the second main body portion of the first drive electrode of the light-emitting element of the third sub-pixel, and the first drive electrode of the light-emitting element of the third sub-pixel at least partially overlaps with the conductive region of the compensation sub-circuit of the fourth sub-pixel in the direction perpendicular to the base substrate.

17. The display substrate according to claim 16, further comprising a scan line extending in the first direction, wherein the scan line is electrically connected to the control electrode of the compensation sub-circuit of the first sub-pixel to provide the scan signal;

the display substrate further comprises a pixel defining layer located on a side of the first drive electrode of the light-emitting element away from the base substrate, the pixel defining layer comprises a plurality of openings to define opening areas of the plurality of sub-pixels, respectively, and at least a part of the light-emitting layer of the light-emitting element of each sub-pixel is located in the opening corresponding to each sub-pixel; and the first sub-pixel, the third sub-pixel, and the fourth sub-pixel are arranged in the first direction; and in the direction perpendicular to the base substrate, the scan line overlaps with both the opening area of the third sub-pixel and the opening area of the fourth sub-pixel.

18. A display device, comprising a display substrate, wherein the display substrate comprises:

a base substrate; and a plurality of sub-pixels in an array on the base substrate;

wherein each of the plurality of sub-pixels comprises a pixel circuit and a light-emitting element, the pixel circuit is configured to drive the light-emitting element to emit light, the pixel circuits of the plurality of sub-pixels are arranged in a first direction and in a second direction, and the first direction is different from the second direction;

the pixel circuit comprises a drive sub-circuit and a compensation sub-circuit;

the drive sub-circuit comprises a control electrode, a first terminal, and a second terminal, and is configured to be connected to the light-emitting element and to control a drive current flowing through the light-emitting element;

the compensation sub-circuit comprises a control electrode, a first electrode, and a second electrode, the control electrode of the compensation sub-circuit is configured to receive a scan signal, the first electrode and the second electrode of the compensation sub-circuit are connected to the second terminal and the control electrode of the drive sub-circuit, respectively, and the compensation sub-circuit is configured to perform threshold compensation on the drive sub-circuit in response to the scan signal;

the light-emitting element comprises a first drive electrode, a light-emitting layer, and a second driving electrode which are stacked in sequence, and the first drive electrode of the light-emitting element is located on a side of the light-emitting layer near the base substrate;

the compensation sub-circuit further comprises a connection portion which is located between the first electrode and the second electrode of the compensation sub-circuit and connects the first electrode to the second electrode; and the first electrode, the second electrode, and the connection portion are all located on a same side of the control electrode of the compensation sub-circuit with respect to the base substrate;

the plurality of sub-pixels comprises a first sub-pixel, and a first drive electrode of a light-emitting element of the first sub-pixel comprises a first main body portion comprising a first side parallel to a certain direction and a first protruding portion protruding from the first side of the first main body portion, and the first protruding portion at least partially overlaps with the connection portion of the compensation sub-circuit of the first sub-pixel in a direction perpendicular to the base substrate; the light-emitting element of the first sub-pixel is configured to emit green light;

the first side of the first main body portion is a straight side and is parallel to the first direction, and the protruding portion protrudes from the first side of the first main body portion in the second direction;

the connection portion comprises a first semiconductor region, a conductive region, and a second semiconductor region, the first semiconductor region separates the first electrode of the compensation sub-circuit from the conductive region, and the second semiconductor region separates the second electrode of the compensation sub-circuit from the conductive region; and the first semiconductor region, the second semiconductor region, the conductive region, the first electrode, and the second electrode of the compensation sub-circuit are located on a same semiconductor layer and are of an integral structure; and the first protruding portion at least partially overlaps with the conductive region of the compensation sub-circuit of the first sub-pixel in the direction perpendicular to the base substrate.

* * * * *